(12) United States Patent
Takeyama

(10) Patent No.: US 10,878,917 B2
(45) Date of Patent: Dec. 29, 2020

(54) MEMORY SYSTEM

(71) Applicant: Toshiba Memory Corporation, Tokyo (JP)

(72) Inventor: Yoshikazu Takeyama, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/557,886

(22) Filed: Aug. 30, 2019

(65) Prior Publication Data

US 2020/0143891 A1 May 7, 2020

(30) Foreign Application Priority Data

Nov. 2, 2018 (JP) .................. 2018-207754

(51) Int. Cl.
| | |
|---|---|
| *G11C 16/04* | (2006.01) |
| *G11C 16/16* | (2006.01) |
| *G11C 11/409* | (2006.01) |
| *G06F 13/16* | (2006.01) |
| *G06F 12/02* | (2006.01) |
| *G11C 11/4076* | (2006.01) |

(52) U.S. Cl.
CPC .......... *G11C 16/16* (2013.01); *G06F 12/0246* (2013.01); *G06F 13/1668* (2013.01); *G11C 11/409* (2013.01); *G11C 11/4076* (2013.01); *G06F 2212/7211* (2013.01)

(58) Field of Classification Search
CPC ... G11C 16/16; G11C 11/4076; G11C 11/409; G06F 12/0246; G06F 13/1668; G06F 2212/7211
USPC ..................................... 365/185.29
See application file for complete search history.

(56) References Cited

U.S. PATENT DOCUMENTS

| | | | |
|---|---|---|---|
| 6,075,723 | A | 6/2000 | Naiki et al. |
| 9,424,927 | B2 | 8/2016 | Chen et al. |
| 2013/0138870 | A1 | 5/2013 | Yoon et al. |
| 2015/0103597 | A1* | 4/2015 | Park ................ G11C 16/26 365/185.03 |
| 2016/0260489 | A1* | 9/2016 | Lee ................ G11C 16/3427 |

* cited by examiner

*Primary Examiner* — Huan Hoang
(74) *Attorney, Agent, or Firm* — Kim & Stewart LLP

(57) ABSTRACT

A memory system includes a semiconductor storage device and a memory controller for the semiconductor storage device. The semiconductor storage device includes a plurality of blocks including a plurality of memory cell transistors. The plurality of blocks includes a first block and a second block. The memory cell transistor in the first block stores data having a first number of bits during a first period and stores data having a second number of bits larger than the first number during a second period that begins after the first period ends.

18 Claims, 16 Drawing Sheets

| WRITE MODE ||
|---|---|
| BUFFER WRITE OPERATION | COMPACTION OPERATION |
| SLC | MLC |
| SLC | TLC |
| SLC | QLC |
| MLC | TLC |
| MLC | QLC |
| TLC | QLC |

BLOCK CONFIGURATION (COMPARISON EXAMPLE OF FIRST EMBODIMENT)

| BLK ADDRESSS | NUMBER OF W/E CYCLES | | |
| --- | --- | --- | --- |
| | SLC MODE | MLC MODE | TOTAL |
| BLK0 | 48 | 24 | 72 |
| BLK1 | 48 | 24 | 72 |
| BLK2 | 36 | 18 | 54 |
| BLK3 | 36 | 18 | 54 |
| ⋮ | ⋮ | ⋮ | ⋮ |
| BLKn | 20 | 10 | 30 |

FIG. 17

| BLK ADDRESSS | NUMBER OF W/E CYCLES | | | | |
| --- | --- | --- | --- | --- | --- |
| | SLC MODE | MLC MODE | TLC MODE | QLC MODE | TOTAL |
| BLK0 | 48 | 24 | 16 | 12 | 100 |
| BLK1 | 48 | 24 | 16 | 12 | 100 |
| BLK2 | 36 | 18 | 12 | 9 | 75 |
| BLK3 | 36 | 18 | 12 | 9 | 75 |
| ⋮ | ⋮ | ⋮ | ⋮ | ⋮ | ⋮ |
| BLKn | 24 | 12 | 8 | 6 | 50 |

FIG. 18

| BLK ADDRESSS | NUMBER OF CONSECUTIVE WRITE | | NUMBER OF W/E CYCLES | | |
| --- | --- | --- | --- | --- | --- |
| | SLC MODE | MLC MODE | SLC MODE | MLC MODE | TOTAL |
| BLK0 | 4 | 0 | 48 | 24 | 72 |
| BLK1 | 4 | 0 | 48 | 24 | 72 |
| BLK2 | 0 | 2 | 36 | 18 | 54 |
| BLK3 | 2 | 0 | 36 | 18 | 54 |
| ⋮ | ⋮ | ⋮ | ⋮ | ⋮ | ⋮ |
| BLKn | 0 | 3 | 20 | 10 | 30 |

BEFORE WRITING

AFTER FIRST STAGE WRITING

AFTER SECOND STAGE WRITING

MEMORY SYSTEM

CROSS-REFERENCE TO RELATED APPLICATION(S)

This application is based upon and claims the benefit of priority from Japanese Patent Application No. 2018-207754, filed Nov. 2, 2018, the entire contents of which are incorporated herein by reference.

FIELD

Embodiments described herein relate generally to a memory system.

BACKGROUND

A NAND flash memory that stores data in a non-volatile manner is known.

DESCRIPTION OF THE DRAWINGS

FIG. 17 shows a table illustrating an example of the number of W/E cycles for each write mode in the memory system according to a modification example of the second embodiment.

FIG. 18 shows a table illustrating an example of the number of times of consecutive write and the number of W/E cycles for each write mode in the memory system according to a third embodiment.

DETAILED DESCRIPTION

Figure 1:
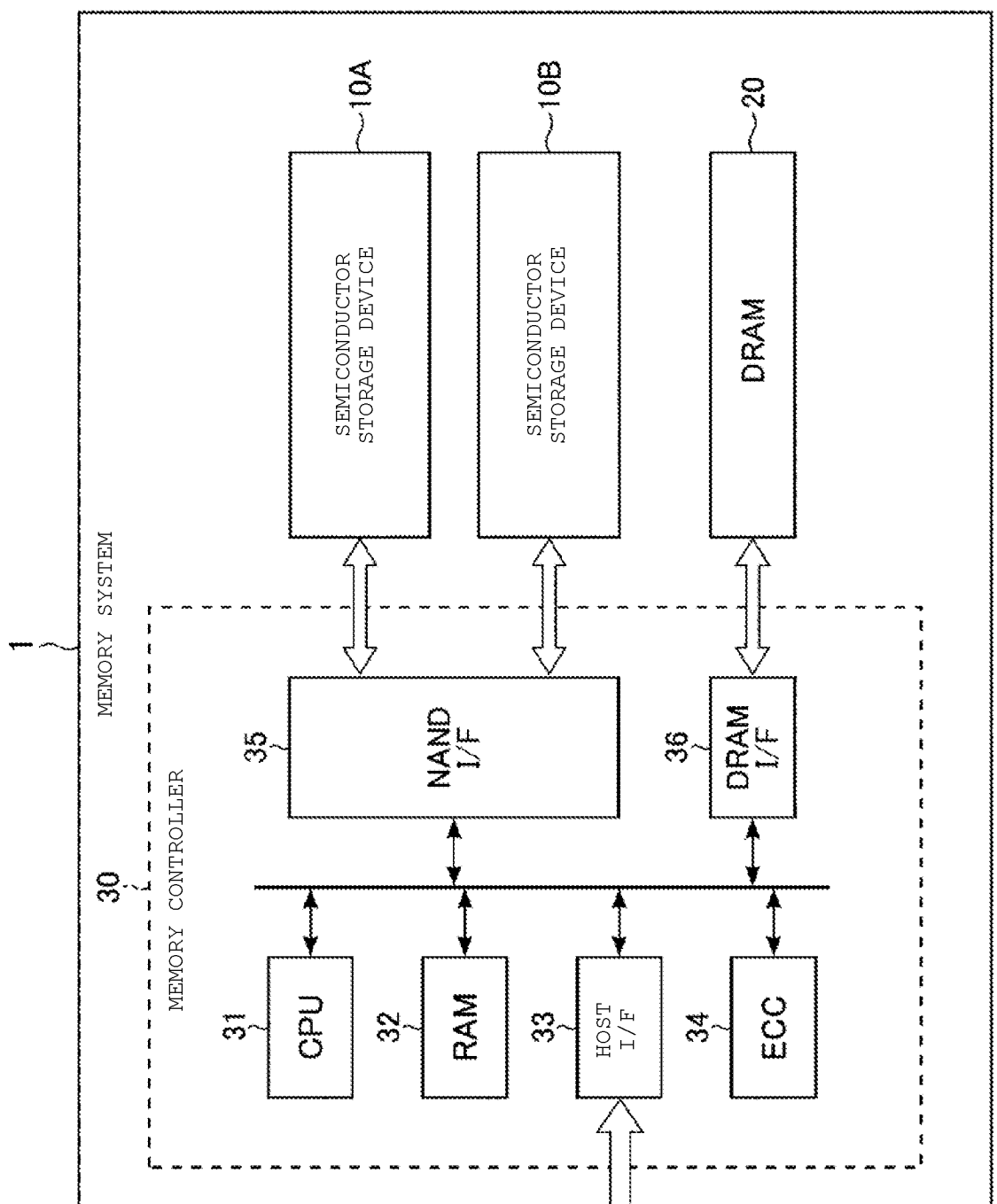
FIG. 1 shows a block diagram of a memory system according to a first embodiment.

Embodiments provide a memory system that improves sequential write performance.

In general, according to one embodiment, a memory system includes a semiconductor storage device and a memory controller for the semiconductor storage device. The semiconductor storage device includes a plurality of blocks including a plurality of memory cell transistors. The plurality of blocks include a first block and a second block. The memory cell transistor in the first block stores data having a first number of bits during a first period and stores data having a second number of bits larger than the first number during a second period that begins after the first period ends.

Hereinafter, embodiments will be described with reference to the drawings. Each embodiment illustrates a device and a method for embodying a technical idea of the present disclosure. The drawings are schematic or conceptual, and the dimension and the proportion of each drawing are not necessarily the same as the actual ones. In the present specification, "connection" indicates that it is electrically connected and does not exclude a connection through a separate conductive element, for example. The "H" level indicates a voltage at which n channel MOS transistor transitions to an ON state and p channel MOS transistor transitions to an OFF state. The "L" level indicates a voltage at which p channel MOS transistor transitions to an ON state and n channel MOS transistor transitions to an OFF state.

In the following description, components having approximately the same functions and configurations are denoted by the same reference numerals. The numbers after letters making up the reference numerals are referenced by the reference numerals with the same letters and are used to distinguish elements having the same configurations. Similarly, the letters after the numbers making up the reference numerals are referenced by the reference numerals with the same numbers and are used to distinguish elements having the same configurations. When it is not necessary to distinguish elements denoted by reference numerals with the same letters or numbers, these elements are respectively referenced by the reference numerals including only letters or numbers.

1. First Embodiment

A memory system 1 according to a first embodiment is a solid state drive (SSD), for example, and may store data in a non-volatile manner. The memory system 1 according to the first embodiment will be described below.

1-1. Configuration 1-1-1. Overall Configuration of Memory System 1

FIG. 1 shows a configuration example of the memory system 1 according to the first embodiment. As shown in FIG. 1, the memory system 1 according to the first embodiment is connected to an external host device 2 and may execute various operations in accordance with an instruction from the host device 2. The memory system 1 according to the first embodiment includes, for example, semiconductor storage devices 10A and 10B, a dynamic random access memory (DRAM) 20, and a memory controller 30.

Each of the semiconductor storage devices 10A and 10B is a NAND flash memory that stores data in a non-volatile manner. The memory system 1 may be designed to have any number of semiconductor storage devices 10. The detailed configuration of the semiconductor storage device will be described below.

The DRAM 20 is a volatile memory used as a storage region of the memory controller 30. The DRAM 20 temporarily stores write data received from the host device 2, for example. The memory controller 30, the host device 2 or the like may have the DRAM 20 built-in.

The memory controller 30 is a system on chip (SoC), for example, and instructs each of the semiconductor storage devices 10A and 10B to read, write, erase and the like in response to a command from the host device 2. Further, the memory controller 30 includes a central processing unit (CPU) 31, a random access memory (RAM) 32, a host interface circuit 33, an error correction code (ECC) circuit 34, a NAND interface circuit 35, and a DRAM interface circuit 36, for example.

The CPU 31 controls the overall operation of the memory controller 30. The CPU 31 issues a write command in response to a write command received from the host device 2. Further, the CPU 31 executes various processes for managing a memory space of the semiconductor storage device 10 such as wear leveling, for example.

The RAM 32 is a volatile memory such as a static random access memory (SRAM), for example. The RAM 32 is used as a work region of the CPU 31, and contains firmware, various management tables, and the like for managing the semiconductor storage device 10, for example.

The host interface circuit 33 is connected to the host device 2 via a host bus and controls a transfer of data, commands, and addresses between the memory controller 30 and the host device 2. The host interface circuit 33 may support communication interface standards such as serial advanced technology attachment (SATA), serial attached SCSI (SAS), PCI Express (PCIe)®, and the like, for example.

The ECC circuit 34 executes a data error correction process. At the time of the write operation, the ECC circuit 34 generates a parity based on the write data received from the host device 2 and gives the generated parity to the write data. At the time of the read operation, the ECC circuit 34 generates a syndrome based on the read data received from the semiconductor storage device 10 and detects and corrects an error in the read data based on the generated syndrome.

The NAND interface circuit 35 controls transmission of data, commands, and addresses between the memory controller 30 and the semiconductor storage device 10, and may independently control semiconductor storage devices 10A and 10B. The NAND interface circuit 35 supports the NAND interface standard.

The DRAM interface circuit 36 is connected to the DRAM 20 and manages communication between the memory controller 30 and the DRAM 20. The DRAM interface circuit 36 supports the DRAM interface standard.

1-1-2. Configuration of Semiconductor Storage Device 10

Figure 2:
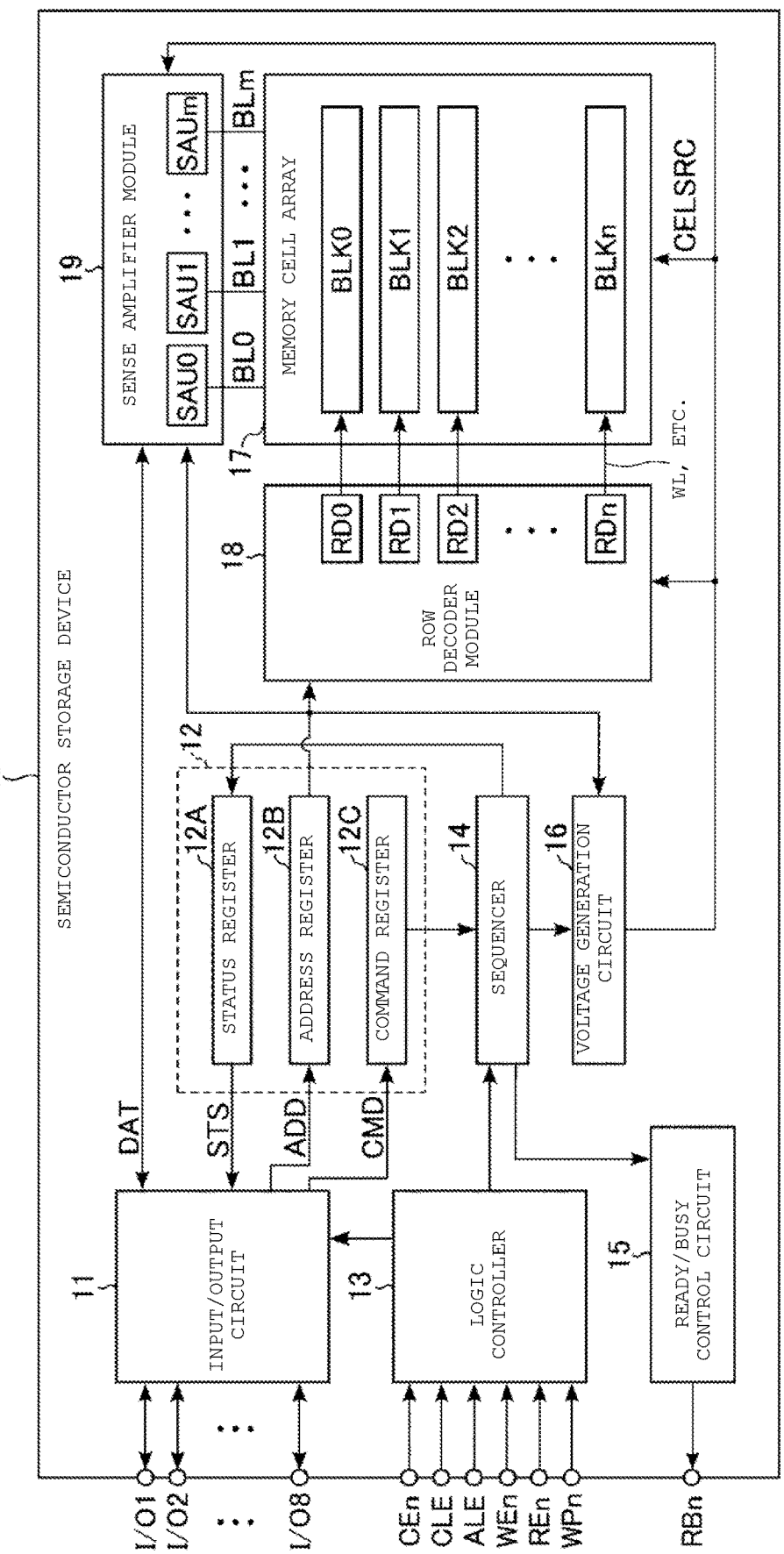
FIG. 2 shows a block diagram of a semiconductor storage device provided in a memory system according to the first embodiment.

FIG. 2 shows a configuration example of the semiconductor storage device 10 provided in the memory system 1 according to the first embodiment. As shown in FIG. 2, the semiconductor storage device 10 includes an input/output circuit 11, a register set 12, a logic controller 13, a sequencer 14, a ready/busy control circuit 15, a voltage generation circuit 16, a memory cell array 17, and a row decoder module 18, and a sense amplifier module 19.

The input/output circuit 11 transmits and receives input/output signals I/O1 to I/O8 with a width of 8 bits to/from the memory controller 30, for example. The input/output signal I/O may include data DAT, status information STS, address information ADD, command CMD and the like. Further, the input/output circuit 11 transmits and receives data DAT to/from the sense amplifier module 19.

The register set 12 includes a status register 12A, an address register 12B, and a command register 12C. The status register 12A, the address register 12B, and the command register 12C store the status information STS, the address information ADD, and the command CMD respectively.

The status information STS is updated based on the operating state of the sequencer 14, for example. The status information STS is transferred from the status register 12A to the input/output circuit 11 based on an instruction from the memory controller 30 and is output to the memory controller 30. The address information ADD is transferred from the input/output circuit 11 to the address register 12B and may include a block address, a page address, a column address and the like, for example. The command CMD is transferred from the input/output circuit 11 to the command register 12C and includes a command regarding various operations of the semiconductor storage device 10.

The logic controller 13 controls each of the input/output circuit 11 and the sequencer 14 based on the control signal received from the memory controller 30. As such control signals, a chip enable signal CEn, a command latch enable signal CLE, an address latch enable signal ALE, a write enable signal WEn, a read enable signal REn, and a write protect signal WPn are used, for example.

The chip enable signal Cen is a signal for enabling the semiconductor storage device 10. The command latch enable signal CLE is a signal for notifying the input/output circuit 11 that the received input/output signal I/O is the command CMD. The address latch enable signal ALE is a signal for notifying the input/output circuit 11 that the received input/output signal I/O is the address information ADD. The write enable signal WEn is a signal for instructing the input/output circuit 11 to input the input/output signal I/O. The read enable signal REn is a signal for instructing the input/output circuit 11 to output the input/output signal I/O. The write protect signal WPn is a signal for putting the semiconductor storage device 10 in a protected state when the power supply is on or off.

The sequencer 14 controls the overall operation of the semiconductor storage device 10. For example, the sequencer 14 executes a read operation, a write operation, an erasing operation and the like based on the command CMD stored in the command register 12C and the address information ADD stored in the address register 12B.

The ready/busy control circuit 15 generates a ready/busy signal RBn based on the operation state of the sequencer 14.

The ready/busy signal RBn is a signal for notifying the memory controller 30 whether the semiconductor storage device 10 is in a ready state or in a busy state. In the present specification, "ready state" indicates that the semiconductor storage device 10 is in a state of being able to receive a command from the memory controller, and "busy state" indicates that the semiconductor storage device is not able to receive a command from the memory controller.

The voltage generation circuit 16 generates a voltage to be used in the read operation, the write operation, the erasing operation, and the like. Then, the voltage generation circuit 16 supplies the generated voltage to the memory cell array 17, the row decoder module 18, and the sense amplifier module 19.

The memory cell array 17 includes a plurality of blocks BLK0 to BLKn (n is an integer of one or more). The block BLK is a set of a plurality of memory cell transistors storing data in a nonvolatile manner and is used as a data erasing unit, for example. Further, a plurality of bit lines BL0 to BLm (m is an integer of one or more), a plurality of word lines WL, a source line CELSRC, and a well line are provided in the memory cell array 17. For example, the voltage generation circuit 16 applies a voltage to the source line CELSRC. Each memory cell transistor is associated with one bit line BL and one word line WL. A detailed circuit configuration of the memory cell array 17 will be described below.

The row decoder module 18 selects a block BLK to execute various operations based on the block address. Then, the row decoder module 18 transfers the voltage supplied from the voltage generation circuit 16 to various wirings in the selected block BLK. Further, the row decoder module 18 also includes a plurality of row decoders RD0 to RDn, for example. The row decoders RD0 to RDn are associated with the blocks BLK0 to BLKn, respectively.

The sense amplifier module 19 reads data from the memory cell array 17 and transfers the read data to the input/output circuit 11 during the read operation. Further, during the write operation, the sense amplifier module 19 applies a desired voltage to the bit line BL based on the data received from the input/output circuit 11. For example, the sense amplifier module 19 includes a plurality of sense amplifier units SAU0 to SAUm. The sense amplifier units SAU0 to SAUm are associated with bit lines BL0 to BLm respectively.

The sense amplifier unit SAU includes a sense amplifier portion SA and latch circuits SDL, ADL, BDL, and XDL, for example. The sense amplifier portion SA determines in the read operation whether the read data is "0" or "1" based on the voltage of the corresponding bit line BL. In other words, the sense amplifier portion SA senses the data read to the corresponding bit line BL and determines the data stored in the selected memory cell. The latch circuit SDL, ADL, BDL, and XDL temporarily store the read data, the write data, and the like respectively. The latch circuit XDL may be used in transmission and reception of data DAT between the sense amplifier unit SAU and the input/output circuit 11.

1-1-3. Circuit Configuration of Memory Cell Array 17

Figure 3:
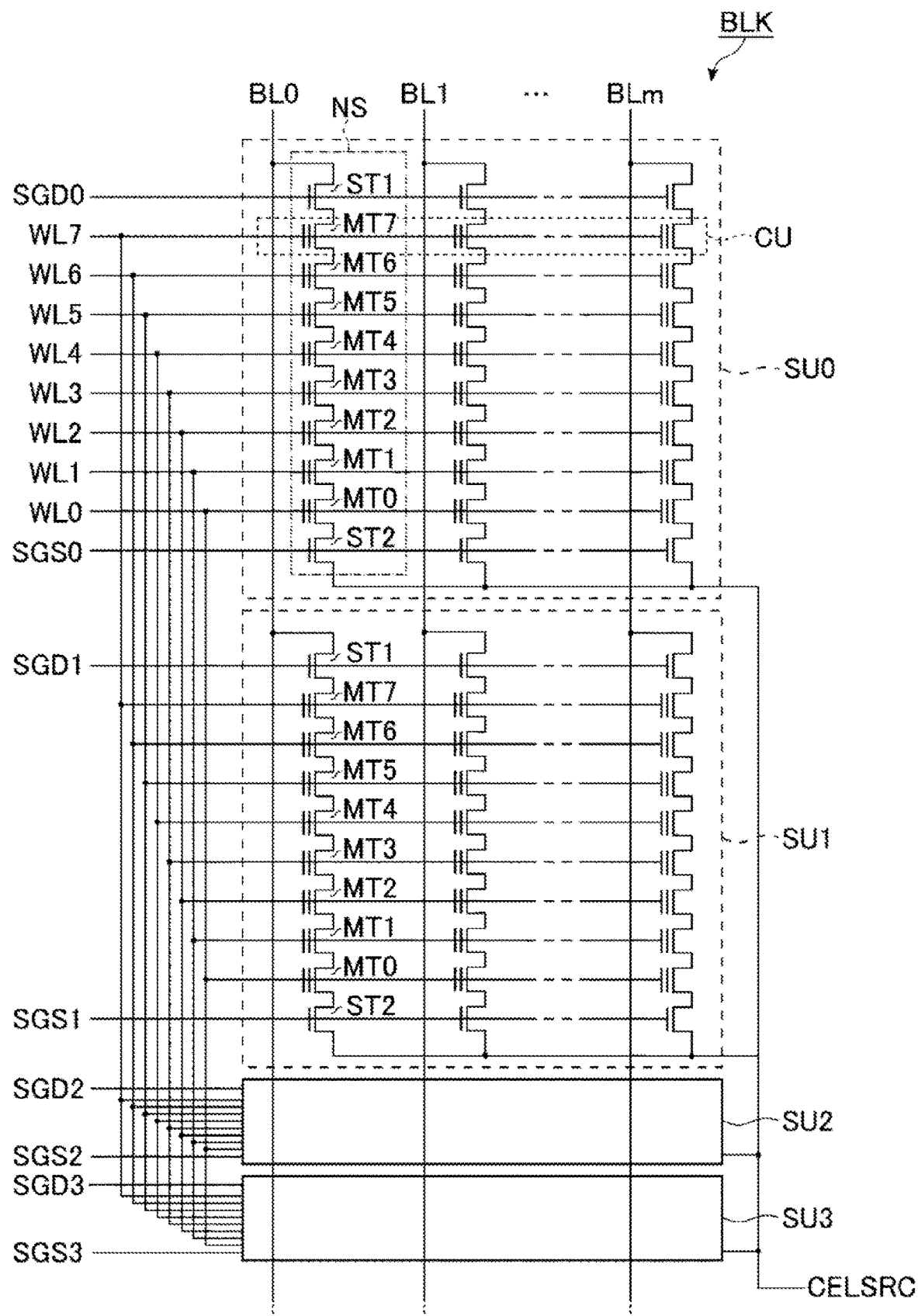
FIG. 3 shows a circuit diagram of a memory cell array in the semiconductor storage device provided in the memory system according to the first embodiment.

FIG. 3 shows an example of a circuit configuration of the memory cell array 17 in the semiconductor storage device 10 provided in the memory system according to the first embodiment and shows one block BLK extracted. As shown in FIG. 3, the block BLK includes four string units SU0 to SU3, for example.

Each string unit SU includes a plurality of NAND strings NS associated with bit lines BL0 to BLm respectively. The NAND string NS includes memory cell transistors MT0 to MT7 and select transistors ST1 and ST2.

The memory cell transistor MT includes a control gate and a charge storage layer and stores data in a non-volatile manner. Each of the select transistors ST1 and ST2 is used to select the string unit SU at the time of various operations.

The memory cell transistors MT0 to MT7 are serially connected in each NAND string NS. The select transistor ST1 connects one end of the memory cell transistors MT0 to MT7 serially connected with the associated bit line BL. A drain of the select transistor ST2 is connected to the other end of the memory cell transistors MT0 to MT7 that are serially connected. The source line CELSRC and the well line CPWELL (not shown) are connected to the source of the select transistor ST2.

Respective gates of the plurality of select transistors ST1 in the string units SU0 to SU3 are commonly connected to the respective select gate lines SGD0 to SGD3 in the same block BLK. Respective control gates of the plurality of memory cell transistors MT0 to MT7 are commonly connected to the respective word line WL0 to WL7. Respective gates of the plurality of select transistors ST2 are commonly connected to the respective select gates SGS0 to SGS3.

The bit lines BL0 to BLm are shared among the plurality of blocks BLK. The same bit line BL is connected to the NAND string NS corresponding to the same column address. Each of the word lines WL0 to WL7 is provided for each block BLK. Each of the source line CELSRC and the well line CPWELL (not shown) is shared among the plurality of blocks BLK, for example.

A set of the plurality of memory cell transistors MT connected to common word line WL in one string unit SU is called a cell unit CU, for example. For example, the storage capacity of a cell unit CU including a memory cell transistor MT storing 1-bit data respectively is defined as "one page data". The cell unit CU may have a storage capacity of two or more page data in accordance with the number of bits of data stored in the memory cell transistor MT.

The circuit configuration of the memory cell array 17 described above is merely an example, and the present disclosure is not limited thereto. For example, the number of the string units SU in each block BLK may be designed to be any number. The numbers of the memory cell transistors MT and the select transistors ST1 and ST2 in each NAND string NS may be designed to be any number respectively.

1-1-4. Data Storage Method

The memory system 1 according to the first embodiment may use a plurality of types of write modes. For example, the memory system 1 according to the first embodiment uses at least two write modes among the single-level cell (SLC) mode, a multi-level cell (MLC) mode, a triple-level cell (TLC) mode, and quadruple-level cell (QLC) mode. The SLC mode, MLC mode, TLC mode, and QLC mode are write modes in which 1-bit data, 2-bit data, 3-bit data, and 4-bit data are stored in one memory cell transistor MT, respectively.

Figure 4:
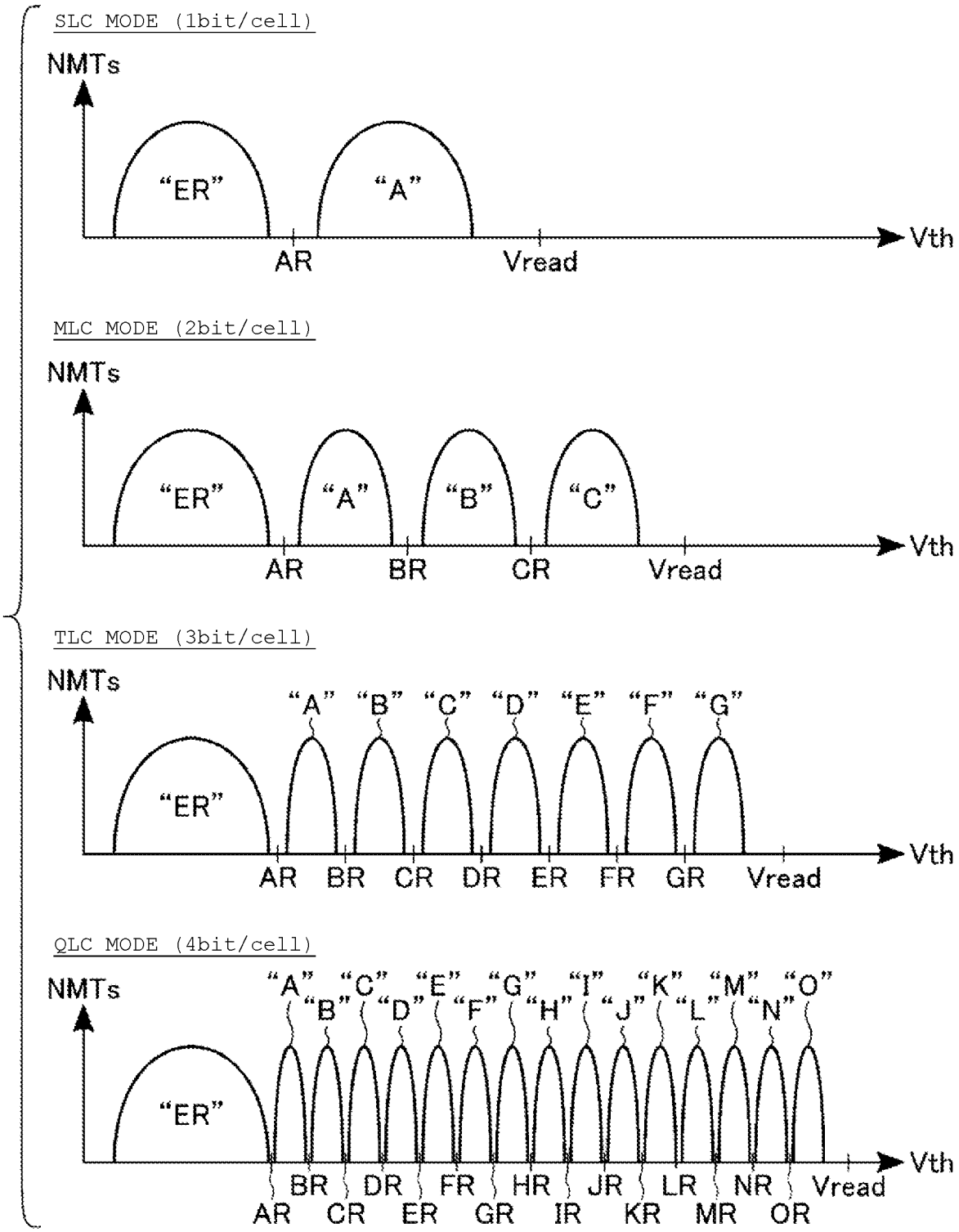
FIG. 4 shows a threshold voltage distribution diagram illustrating different examples of a distribution of threshold voltages of memory cell transistors in the memory system according to the first embodiment.

FIG. 4 shows different examples of a distribution of threshold voltages of the memory cell transistors MT in the memory system 1 according to the first embodiment. FIG. 4 depicts four types of threshold voltage distributions and read voltages corresponding to the SLC mode, the MLC mode, the TLC mode, and the QLC mode. In the threshold voltage distributions shown in FIG. 4, the vertical axis corresponds to the number NMTs of the memory cell transistor MT and the horizontal axis corresponds to the threshold voltage Vth of the memory cell transistor MT. As shown in FIG. 4, a plurality of the memory cell transistors MT form a plurality of threshold voltage distributions in accordance with the applied write modes, that is, the number of bits of the data to be stored.

When the SLC mode (1 bit/cell) is used, the threshold voltages of the plurality of memory cell transistors MT form two threshold voltage distributions. The two threshold voltage distributions are referred to as, for example, an "ER" state and an "A" state, respectively, in the ascending order of the threshold voltage, for example. In the SLC mode, 1-bit data different from each other are assigned to the respective threshold voltage distributions of the "ER" state and the "A" states.

When the MLC mode (2 bits/cell) is used, the threshold voltages of the plurality of memory cell transistors MT form four threshold voltage distributions. The four threshold voltage distributions are referred to as the "ER" state, the "A" state, the "B" state, and the "C" state, respectively, in the ascending order of the threshold voltage, for example. In the MLC mode, 2-bit data different from each other are assigned to the respective threshold voltage distributions of the "ER" state to the "C" state.

When the TLC mode (3 bits/cell) is used, the threshold voltages of the plurality of memory cell transistors MT form eight threshold voltage distributions. The eight threshold voltage distributions are referred to as the "ER" state, the "A" state, the "B" state, the "C" state, the "D" state, the "E" state, the "F" state, and the "G" state, respectively, in the ascending order of the threshold voltage, for example. In the TLC mode, 3-bit data different from each other are assigned to the respective threshold voltage distributions of the "ER" state to the "G" state.

When the QLC mode (4 bits/cell) is used, the threshold voltages of the plurality of memory cell transistors MT form 16 threshold voltage distributions. The sixteen threshold voltage distributions are referred to as the "ER" state, the "A" state, the "B" state, the "C" state, the "D" state, the "E" state, and the "F" state, "G" state, "H" state, "I" state, "J" state, "K" state, "L" state, "M" state, "N" state, and "O" state, respectively, in the ascending order of the threshold voltage, for example. In the TLC mode, 4-bit data different from each other are assigned to the respective threshold voltage distributions of the "ER" state through "O" state.

In each write mode, the read voltage is set between adjacent threshold voltage distributions. Specifically, the read voltage AR is set between the maximum threshold voltage in the "ER" state and the minimum threshold voltage in the "A" state. Similarly, the read voltage BR is set between the "A" state and "B" state, the read voltage CR is set between the "B" state and "C" states, the read voltage DR is set between "C" state and "D" state, the read voltage ER is set between the "D" state and the "E" state, the read voltage FR is set between the "E" state and the "F" state, the read voltage GR is set between the "F" state and "G" state, the read voltage HR is set between the "G" state and "H" state, the read voltage IR is set between the "H" state and "I" state, the read voltage JR is set between the "I" state and "J" state, the read voltage KR is set between the "J" state and "K" state, the read voltage LR is set between the "K" state and "L" state, the read voltage MR is set between the "L" state and "M" state, the read voltage NR is set between the "M" state and "N" state, and the read voltage OR is set between the "N" state and "O" state.

The read pass voltage Vread is set to a voltage higher than the maximum threshold voltage in the highest threshold voltage distribution in each write mode. The memory cell transistor MT to which the read pass voltage Vread is applied to the gate transitions to an ON state regardless of the data to be stored.

Further, in each write mode, a verification voltage is set between adjacent threshold voltage distributions. Specifically, in the write operation, respective verification voltages AV, BV, CV, DV, EV, FV, GV, HV, IV, JV, KV, LV, MV, NV, and OV are used in the respective verification operations of "A" state, "B" state, "C" state, "D" state, "E" state, "F" state, "G" state, "H" state, "I" state, "J" state, "K" state, "L" state, "M" state, "N" state, and "O" state. For example, the verification voltages AV to OV are set to voltages higher than the respective read voltages AR to OR.

The number of bits of data stored in one memory cell transistor MT described above is an example, and the present disclosure is not limited thereto. For example, data of 5 or more bits may be stored in the memory cell transistor MT. Further, each of the read voltage, the read pass voltage, and the verification voltage may be set to the same voltage value in each write mode or may be set to different voltage values.

1-2. Operation

Next, the operation of the memory system 1 according to the first embodiment will be described. In the following description, the selected word line WL is referred to as a selected word line WLsel. The application of voltage to the word line WL by the voltage generation circuit 16 corresponds to the application of voltage to the word line WL via the signal line CG and the row decoder module 18 by the voltage generation circuit 16. The address information ADD received by the semiconductor storage device 10 is transferred to the address register 12B. The command CMD received by the semiconductor storage device 10 is transferred to the command register 12C.

1-2-1. Outline of Write Operation

Figures 5, 6:
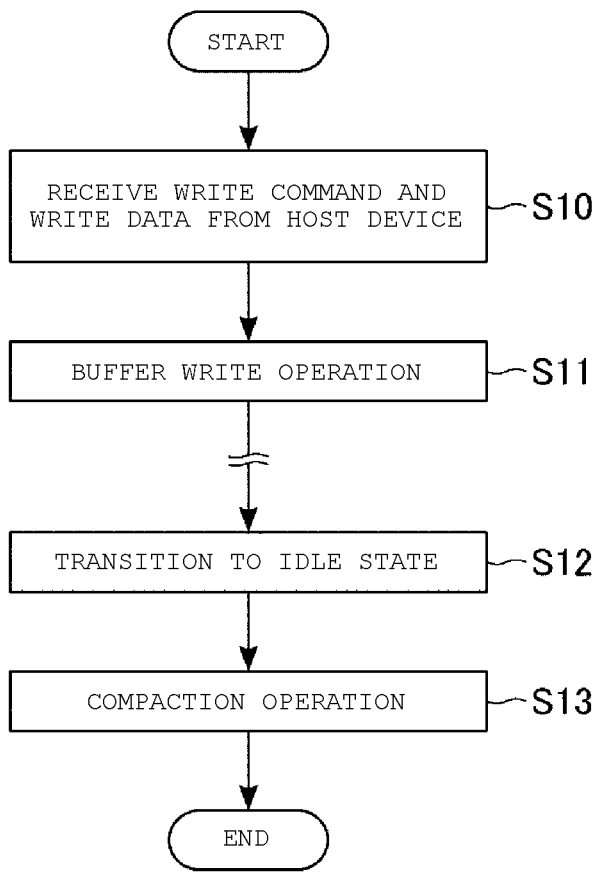
FIG. 5 shows a flowchart illustrating an example of a write operation of the memory system according to the first embodiment.
FIG. 6 shows a table illustrating an example of a combination of write modes used in the write operation of the memory system according to the first embodiment.

First, an outline of the write operation in the memory system 1 according to the first embodiment will be described. The memory system 1 according to the first embodiment executes at least two write operations in response to the write data received from the host device 2. FIG. 5 shows an example of the flow of the write operation by the memory system 1 according to the first embodiment.

As shown in FIG. 5, first, the memory system 1 receives a write command and write data from the host device 2 (step S10). Then, the memory system 1 executes a buffer write operation of the received write data (step S11). The buffer write operation is a high-speed write operation that causes the semiconductor storage device 10 to temporarily store data in the memory cell array 17.

After step S11, when the task based on the command from the host device 2 is completed, the memory system 1 transitions to an idle state (step S12). When the memory system 1 transitions to the idle state, the memory system 1 executes the compaction operation without relying on a command from the host device 2 (step S13). The compaction operation includes a buffer read operation and a compaction write operation. The buffer read operation is an operation of reading data written by the buffer write operation. The compaction write operation is an operation of writing the data, read by the buffer read operation, into the semiconductor storage device 10 using the write mode in which the number of stored bits is larger than in the write mode applied to the buffer write operation.

FIG. 5 shows an example of a case where the memory system 1 moves to the compaction operation based on the transition to the idle state, and the present disclosure is not limited thereto. For example, the memory system 1 may move straight from the buffer write operation to the compaction operation.

FIG. 6 shows an example of combinations of write modes used in the write operation of the memory system 1 according to the first embodiment and shows a case where the memory system 1 uses two types of write modes.

As shown in FIG. 6, when the SLC mode is used in the buffer write operation, the MLC mode, the TLC mode, or the QLC mode are used in the compaction operation, for example. When MLC mode is used in the buffer write operation, TLC mode or QLC mode are used in the compaction operation, for example. When the TLC mode is used in the buffer write operation, the QLC mode is used in the compaction operation, for example.

The memory system 1 may use three or more write modes in the write operation. In this case, the memory system 1 executes a plurality of compaction operations. Specifically, when three write modes are used and the SLC mode is used for the buffer write operation, the MLC mode and the TLC mode are sequentially used in the compaction operation, the MLC mode and the QLC mode are sequentially used, or the TLC mode and the QLC mode are sequentially used. When three write modes are used and the MLC mode is used in buffer write operation, the TLC mode and the QLC mode are sequentially used in the compaction operation. When four write modes are used, the MLC mode, the TLC mode, and the QLC mode are sequentially used in the compaction operation.

In the following, specific examples of command sequences and timing charts of the buffer write operation and the compaction operation when the SLC mode is used in the buffer write operation and the MLC mode is used in the compaction operation will be sequentially described.

Buffer Write Operation

Figure 7:
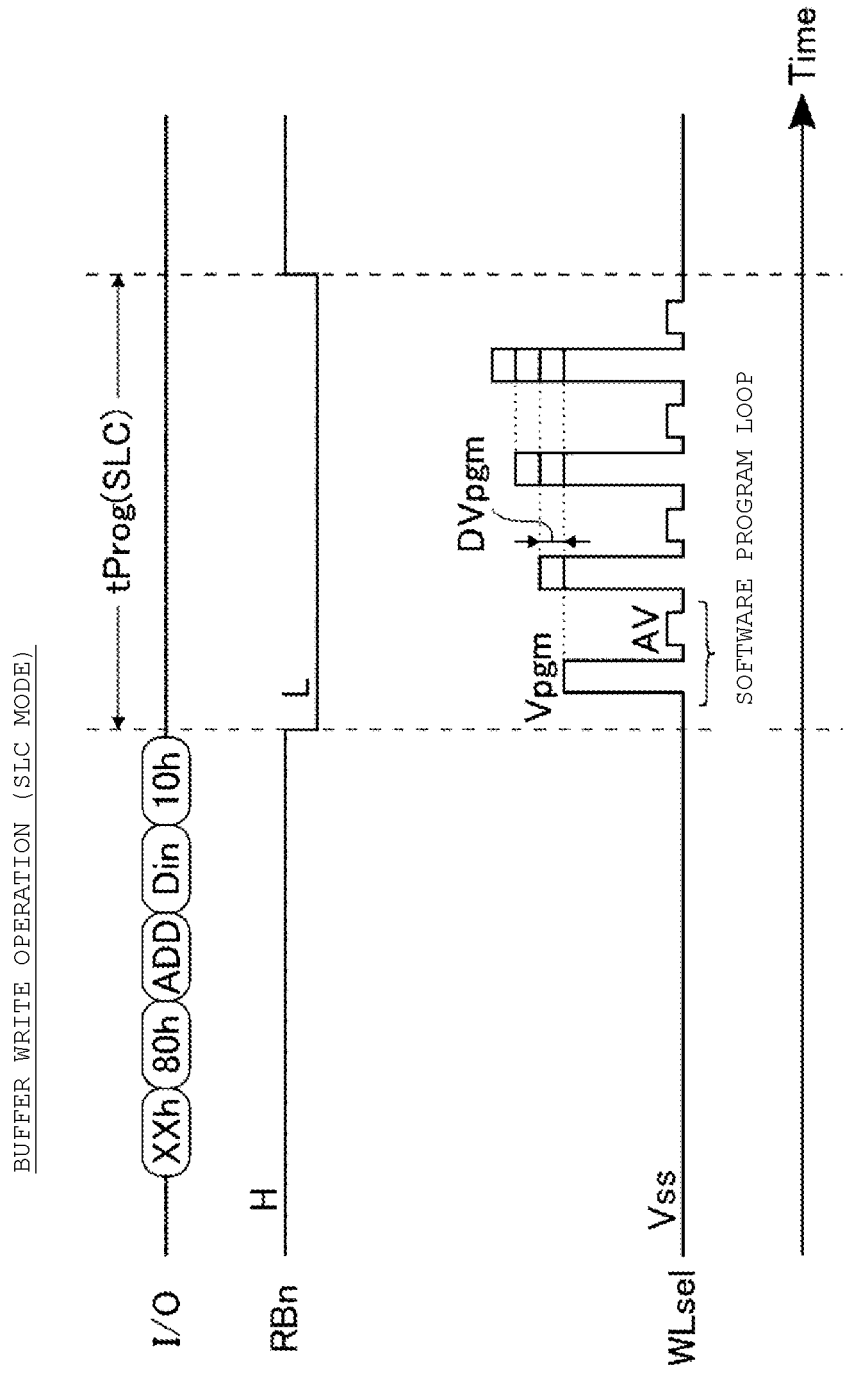
FIG. 7 shows a command sequence and timing chart illustrating an example of a buffer write operation of the memory system according to the first embodiment.

FIG. 7 shows an example of a command sequence and a timing chart in the buffer write operation in the SLC mode in the memory system 1 according to the first embodiment. In the same drawings to be referred to below, the ready/busy signal RBn before each operation is at the "H" level, and the voltage of the selected word line WLsel is Vss. The initial value of the voltage of selected word line WLsel is not limited to Vss, and may be set to any voltage value.

As shown in FIG. 7, the memory controller 30 sequentially transmits a command "XXh", a command "80h", the address information "ADD", a write data "Din", and a command "10h" to the semiconductor storage device 10 in the buffer write operation of the SLC mode. The command "XXh" is a command of instructing operation of the SLC mode. The command "80h" is a command of instructing operation of the write operation. The write data "Din" is transferred to the latch circuit XDL of the sense amplifier unit SAU in the sense amplifier module 19. The command "10h" is a command of instructing the execution of the write operation.

On receiving the command "10h", the semiconductor storage device 10 transitions from the ready state to the busy state. Then, the sequencer 14 executes the write operation in the SLC mode based on the command stored in the command register 12C and the data stored in the sense amplifier module 19.

The sequencer 14 repeatedly executes the software program loop in the write operation. Each software program loop includes a program operation and a verification operation. Here, the program operation and the verification operation will be described with reference to the voltage of the selected word line WLsel in the first software program loop.

The program operation is an operation of raising the threshold voltage of the memory cell transistor MT. In the program operation, based on the data stored in the internal latch circuit, each sense amplifier unit SAU sets the corresponding bit line BL as a write target or write protect. Then, the program voltage Vpgm is applied to the selected word line WLsel in the program operation. The program voltage Vpgm is a high voltage capable of raising the threshold voltage of the memory cell transistor MT.

When the program voltage Vpgm is applied to the selected word line WLsel, the threshold voltage of the memory cell transistor MT connected to the selected word line WLsel and connected to the bit line BL of the write target rises. On the other hand, the threshold voltage of the memory cell transistor MT connected to the selected word line WLsel and connected to the bit line BL of the write protect is prevented from rising by self-boosting. A series of these operations corresponds to program operations. When the program operation is completed, the sequencer 14 moves to the verification operation.

The verification operation is a read operation of determining whether the memory cell transistor MT reached a desired threshold voltage. In the verification operation, a write level to be verified is set for each sense amplifier unit SAU based on the write data stored by each sense amplifier unit SAU. In the write operation in the SLC mode, a read operation using the very voltage AV is executed.

Specifically, when the verification voltage AV is applied to the selected word line WLsel, each sense amplifier unit SAU determines whether the threshold voltage of the memory cell transistor MT connected to the selected word line WLsel exceeds the verification voltage AV based on the voltage of the corresponding bit line BL. Then, the sense amplifier unit SAU stores the determination result in any internal latch circuit. For example, the sequencer 14 determines that the verification has passed when the threshold voltage of the memory cell transistor MT into which data of "A" state is written exceeds the verification voltage AV and determines that the verification has failed when the threshold voltage is equal to or less than the verification voltage AV. The sequencer 14 ends the verification operation when these determinations are completed.

The combination of the program operation and the verification operation described above corresponds to one software program loop. The program voltage Vpgm is stepped up in the program operation in the subsequent software program loop. The step-up amount DVpgm of the program voltage Vpgm may be set to any value. Then, when the sequencer 14 determines that the number of the memory cell transistor MT not passing the verification operation of "A" state in the repetition of the software program loop is below a predetermined number, the sequencer 14 causes the semiconductor storage device 10 to transition from the busy state to the ready state and ends the write operation of the SLC mode.

When the write operation of the SLC mode ends, one page data is written into the cell unit CU connected to the selected word line WLsel. The illustrated tProg (SLC) corresponds to the time when the SLC mode write operation is executed. Then, the write operation in the SLC mode described above is executed at least twice, with different addresses being specified, in the buffer write operation when the MLC mode is used in the compaction operation.

Compaction Operation

Figure 8:
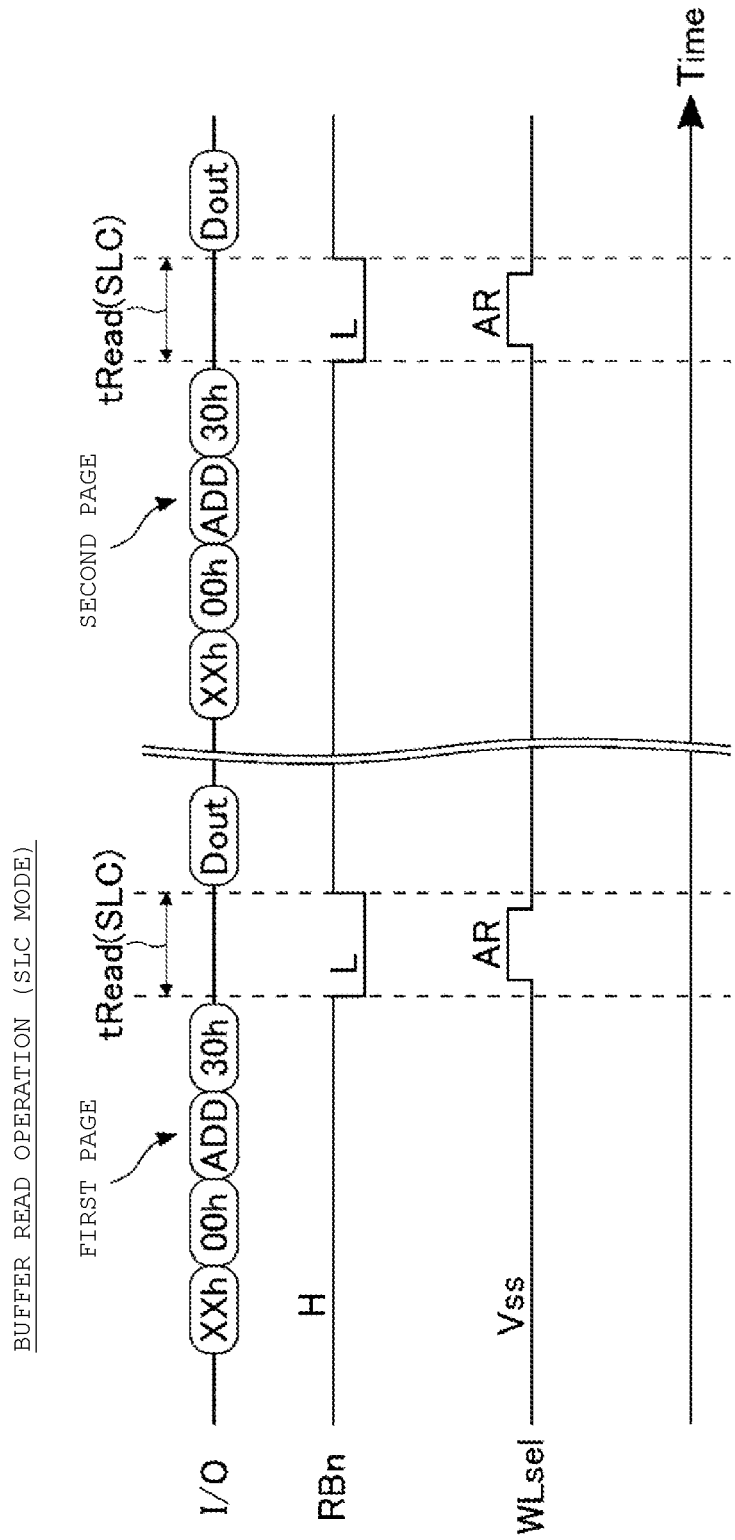
FIG. 8 shows a command sequence and timing chart illustrating an example of a buffer read operation of the memory system according to the first embodiment.

Next, an example of each of the buffer read operation and the compaction write operation in the compaction operation will be sequentially described. FIG. 8 shows an example of a command sequence and a timing chart in the buffer read operation in the SLC mode in the memory system 1 according to the first embodiment.

As shown in FIG. 8, in the buffer read operation in the SLC mode, the memory controller 30 transmits the command "XXh", a command "00h", the address information "ADD", and a command "30h" to the semiconductor storage device 10 sequentially, for example. The command "00h" is a command of instructing a read operation. Address information "ADD" is an address at which a buffer write operation is executed. The command "30h" is a command of instructing the execution of the read operation.

When the semiconductor storage device 10 receives the command "30h", the semiconductor storage device 10 transitions from the ready state to the busy state and executes the read operation in the SLC mode. In the read operation in the SLC mode, the read voltage AR is applied to the selected word line Wlsel, and the read voltage AR is applied whereby data is read in the sense amplifier module 19 and the read data is determined.

When the read data is determined, the sequencer 14 causes the semiconductor storage device 10 to transition from the busy state to the ready state. The illustrated tRead (SLC) corresponds to the time when the read operation in the SLC mode is executed. Upon determining, after instructing the execution of the read operation, that the semiconductor storage device 10 transitions from the busy state to the ready state, the memory controller 30 outputs the read data stored in the sense amplifier module 19 to the semiconductor storage device 10. (FIG. 8, "bout").

Upon receiving the read data from the semiconductor storage device 10, the memory controller 30 executes an error correction process using the ECC circuit 34. Then, the memory controller 30 causes the DRAM 20 to store the error-corrected read data, for example. The read data may be stored in the memory controller 30.

The buffer read operation in the SLC mode described above is executed twice in succession when the MLC mode is used in the compaction operation. The address information ADD specified by the memory controller 30 is different in the read operation of the first page and the read operation of the second page consecutively executed.

Figure 9:
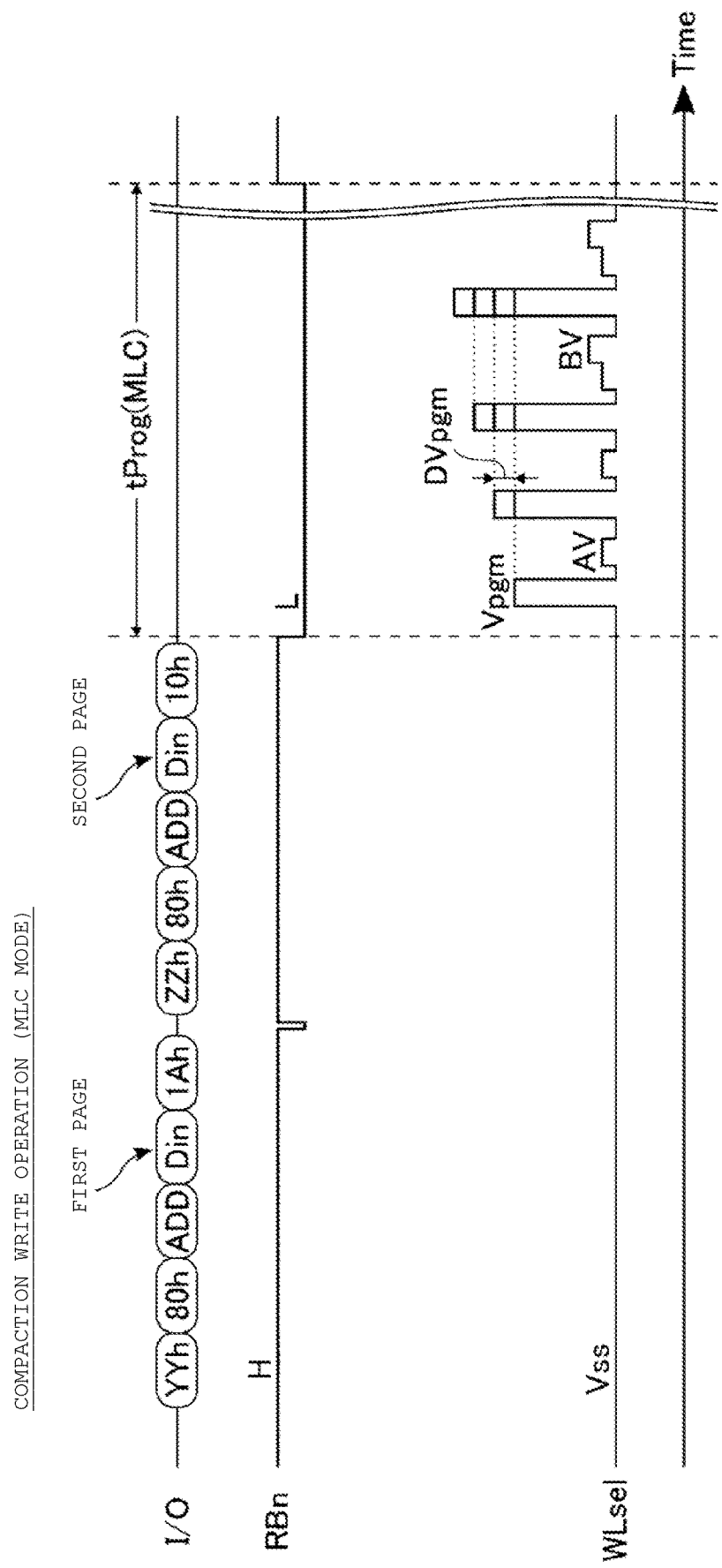
FIG. 9 shows a command sequence and timing chart illustrating an example of a compaction write operation of the memory system according to the first embodiment.

Next, the details of the compaction write operation will be described. When the memory controller 30 obtains two pages of the read data by the buffer read operation, the memory controller 30 executes the compaction write operation. FIG. 9 shows an example of a command sequence and a timing chart in the compaction write operation in the MLC mode in the memory system 1 according to the first embodiment.

As shown in FIG. 9, in the compaction write operation in the MLC mode, the memory controller 30 sequentially transmits a command "YYh", the command "80h", the address information "ADD", the write data "Din" in the lower page, and a command "1Ah" to the semiconductor storage device 10. The command "YYh" is a command of instructing an operation corresponding to the lower page. The address information "ADD" in the first page is different from the address in the corresponding buffer read operation. The command "1Ah" is a command of instructing a transfer between latches of data stored in the sense amplifier module 19. When the semiconductor storage device 10 receives the command "1Ah", the semiconductor storage device 10 temporarily transitions from the ready state to the busy state and transfers the write data in the lower page stored in the latch circuit XDL to the other latch circuits.

Subsequently, the memory controller 30 sequentially transmits a command "ZZh", the command "80h", the address information "ADD", the write data "Din" in the upper page, and the command "10h" to the semiconductor storage device 10. The command "ZZh" is a command of instructing an operation corresponding to the upper page. The address information "ADD" in the second page includes the same address as the address information "ADD" in the first page, for example. On receiving the command "10h", the semiconductor storage device 10 transitions from the ready state to the busy state and executes the write operation in the MLC mode based on the command stored in the command register 12C and the second page data stored in the sense amplifier module 19.

A plurality of write levels are set in the write operation in the MLC mode such that a software program loop which is the same as the software program loop in the write operation in the SLC mode is executed. Then, a plurality of types of verification voltages may be applied in the verification operation in the write operation in the MLC mode. Further, the type and the number of verification voltages applied in the verification operation may be appropriately changed in accordance with the progress of the software program loop. In the example shown in FIG. 9, the sequencer 14 executes the verification operation in the "A" state by the verification operation in the first and the second software program loops and executes each of the verification operations of "A" state and "B" state by the verification operation in the third and the fourth software program loops.

When the sequencer 14 determines that the number of the memory cell transistors MT that has not passed the verification of the threshold voltage level, among the memory cell transistors MT to be written to a certain threshold voltage level, falls below a predetermined number, it is considered that the verification of the threshold voltage level has passed, that is, that the writing of data corresponding to the threshold voltage level is completed. When the sequencer 14 determines, by a repetition of the software program loop, that the verification of the all of the threshold voltage levels has passed, the sequencer 14 ends the write operation in MLC mode.

When the write operation in the MLC mode ends, the second page data is written into the cell unit CU connected to the selected word line WLsel. The illustrated tProg (MLC) corresponds to the time when the write operation in MLC mode is executed. The length of tProg (MLC) is longer than tProg (SLC).

When the compaction operation described above, that is, a combination of the buffer read operation and the compaction write operation are executed, the second page data stored in two cell units CU is stored in one cell unit CU. In other words, when the buffer write operation of 2 BLK of data is executed, for example, the 2 BLK of data written by the buffer write operation is compressed into 1 BLK of data by the compaction operation, and is stored.

The first program voltage Vpgm in the write operation in the SLC mode may be different from the first program voltage Vpgm in the write operation in the MLC mode. Similarly, the step-up amount DVpgm in the write operation in the SLC mode may be different from the step-up amount DVpgm in the write operation in the MLC mode. This also applies to the write operations in other write modes.

In the compaction operation, the buffer read operation and the compaction write operation may not necessarily be alternately executed in the minimum unit. For example, in the compaction operation in which the MLC mode is used, the memory controller 30 may consecutively execute the compaction write operations after acquiring a predetermined amount of page data by consecutively executing the buffer read operations.

A case where the ECC circuit 34 executes an error correction process in the buffer read operation is presented as an example in the above description, and the present disclosure is not limited thereto. For example, the memory controller 30 causes the semiconductor storage device 10 to store the data read in a plurality of buffer read operations in different latch circuits in the sense amplifier module 19, and to execute the compaction write operation without data output to the memory controller 30.

1-2-2. Allocation of Block BLK in Write Operation

The memory system 1 according to the first embodiment may use all the blocks BLK in both the buffer write and compaction operations. That is, in the memory system 1 according to the first embodiment, a write operation in which a different write mode is used may be executed in each block BLK. In the following, as a specific example, the case where the buffer write operation and the compaction operation are executed in block BLK units, the SLC mode is used in the buffer write operation, and the MLC mode is used in the compaction write operation will be described.

Figure 10:
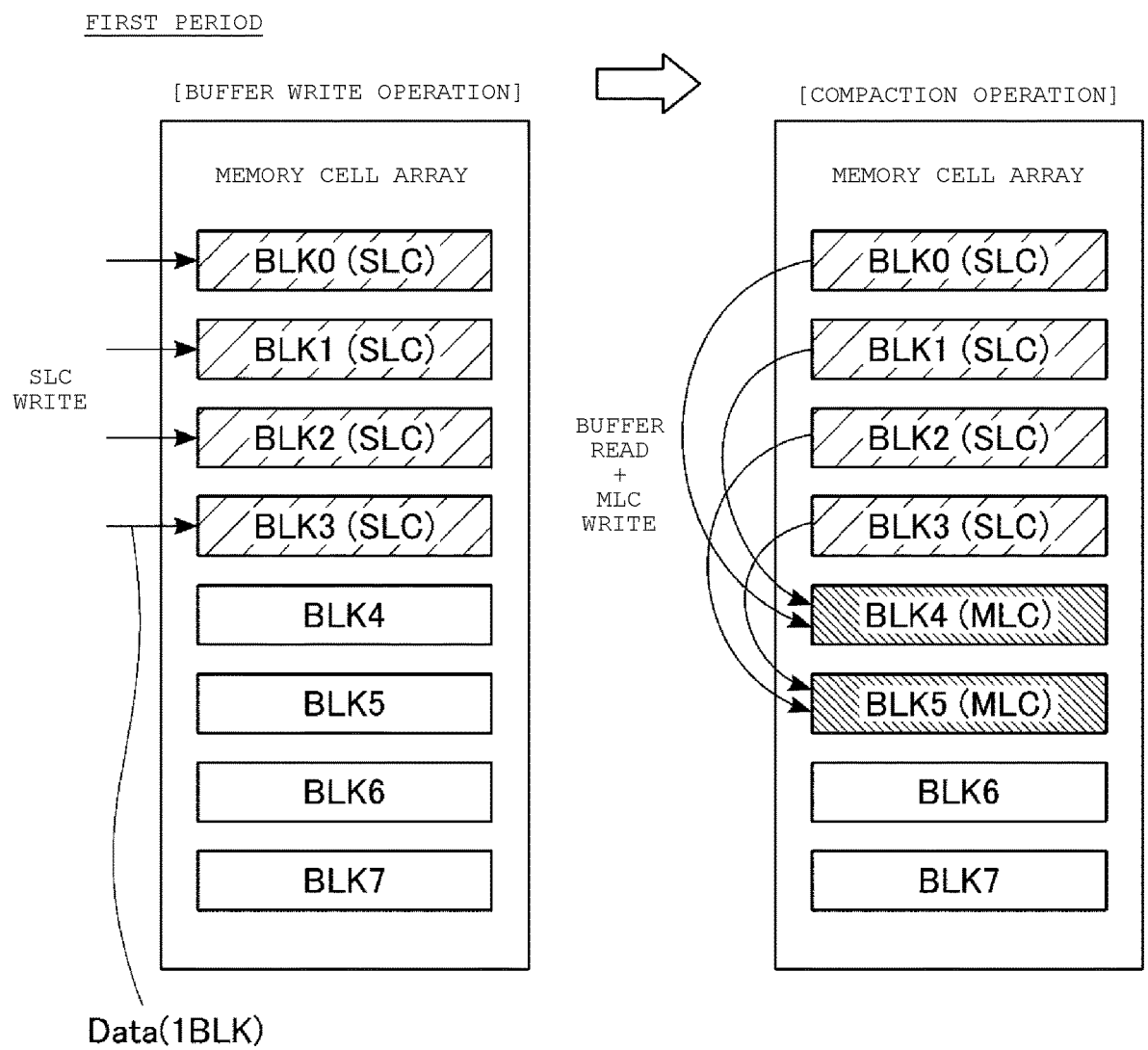
FIG. 10 shows a schematic view illustrating an example of a write target block of the write operation in a first period in the memory system according to the first embodiment.
Figure 11:
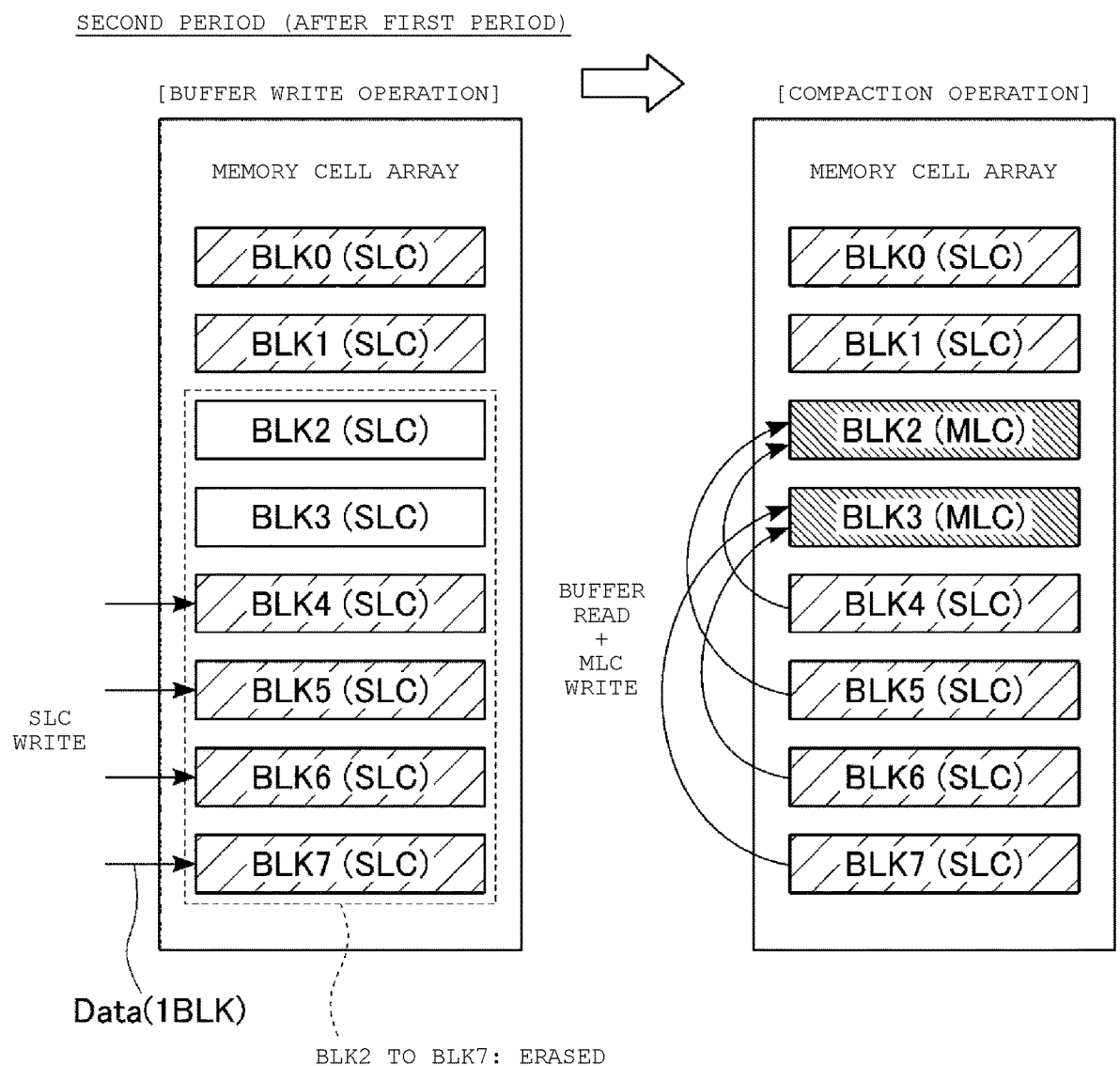
FIG. 11 shows a schematic view illustrating an example of a write target block of the write operation in a second period in the memory system according to the first embodiment.

FIGS. 10 and 11 show an example of a write target block in the write operation of the memory system 1 according to the first embodiment. FIG. 10 corresponds to the write operation executed in the first period, and FIG. 11 corresponds to the write operation executed in the second period after the first period. In the present example, to simplify the description, it is assumed that the memory cell array 17 includes eight blocks BLK0 to BLK7 and that the host device 2 instructs the memory system 1 to sequentially write 4 BLK of data in each period.

First, the write operation executed in the first period will be described. As shown in FIG. 10, when the memory system 1 receives 4 BLK of write data from the host device 2, the memory system 1 executes the buffer write operation. In this buffer write operation, the memory system 1 sequentially executes the write operations in the SLC mode to the blocks BLK0 to BLK3, for example. As a result, one page data is written into each cell unit CU in the blocks BLK0 to BLK3.

Thereafter, when the memory system 1 transitions to the idle state, the memory system 1 executes the compaction operation. In this compaction operation, the memory system 1 reads a total of 2 BLK of data from the blocks BLK0 and BLK1 by buffer read operation and stores the 2 BLK of read data in the block BLK4 by the compaction write operation in the MLC mode. Similarly, the memory system 1 reads a total of 2 BLK of data from the blocks BLK2 and BLK3 by a buffer read operation and stores the 2 BLK of read data in the block BLK5 by a compaction write operation in the MLC mode. As a result, the two page data is written into each cell unit CU in the blocks BLK4 and BLK5.

Next, the write operation executed in the second period will be described. In the second period, it is assumed that the data written in the blocks BLK2 to BLK7 in the first period is erased previously. As shown in FIG. 11, when the memory system 1 receives 4 BLK of write data from the host device 2, the memory system 1 executes the buffer write operation. In this buffer write operation, the memory system 1 sequentially executes the write operations in the SLC mode to the blocks BLK4 to BLK7, for example. As a result, one page data is written into each cell unit CU in the blocks BLK4 to BLK7.

Thereafter, when the memory system 1 moves to an idle state, the memory system 1 executes the compaction operation. In this compaction operation, the memory system 1 reads a total of 2 BLK of data from the blocks BLK4 and BLK5 by the buffer read operation and stores the 2 BLK of read data in the block BLK2 by compaction write operation in the MLC mode. Similarly, the memory system 1 reads a total of 2 BLK of data from the blocks BLK 6 and BLK 7 by the buffer read operation and stores the 2 BLK of read data in the block BLK 3 by the compaction write operation in the MLC mode. As a result, the two page data is written into each cell unit CU in the blocks BLK2 and BLK3.

As described above, data is written into each of the blocks BLK0 to BLK3 in the SLC mode and data is written into each of the blocks BLK4 and BLK5 in the MLC mode in the first period. On the other hand, data is written into each of blocks BLK4 to BLK7 in the SLC mode and data is written into each of blocks BL K2 and BLK3 in the MLC mode in the second period after the first period.

That is, in this example, the blocks BLK2 and BLK3 respectively store the data written in the SLC mode by the process in the first period and store the data written in the MLC mode by the process of the second period. In other words, the cell unit CU in the blocks BLK2 and BLK3 stores one page data in the SLC mode and then stores two page data in the MLC mode.

A case where the SLC mode is used in the buffer write operation and the MLC mode is used in the compaction write operation is presented as an example in the above description, and the present disclosure is not limited thereto. The buffer write operation and the compaction operation may be executed in a combination shown in FIG. 6, for example. That is, in the memory system 1 according to the first embodiment, different write modes may be used in different periods and data of different number of bits may be stored in the cell units CU in a certain block BLK.

1-3. Effects of the First Embodiment

According to the memory system 1 according to the first embodiment described above, it is possible to prevent a reduction in the operating speed of sequential writing of the memory system 1. The detailed effects on the memory system 1 according to the first embodiment will be described below.

One of the performance requirements for a memory system such as SSD is the operating speed of sequential writing. The sequential writing is equivalent to an operation in which the memory system consecutively writes the write data received from the host device. One method of raising the operating speed of the sequential writing is first writing the write data that the SSD received from the host device into the buffer region by the high-speed write operation in the SLC mode.

Figure 12:
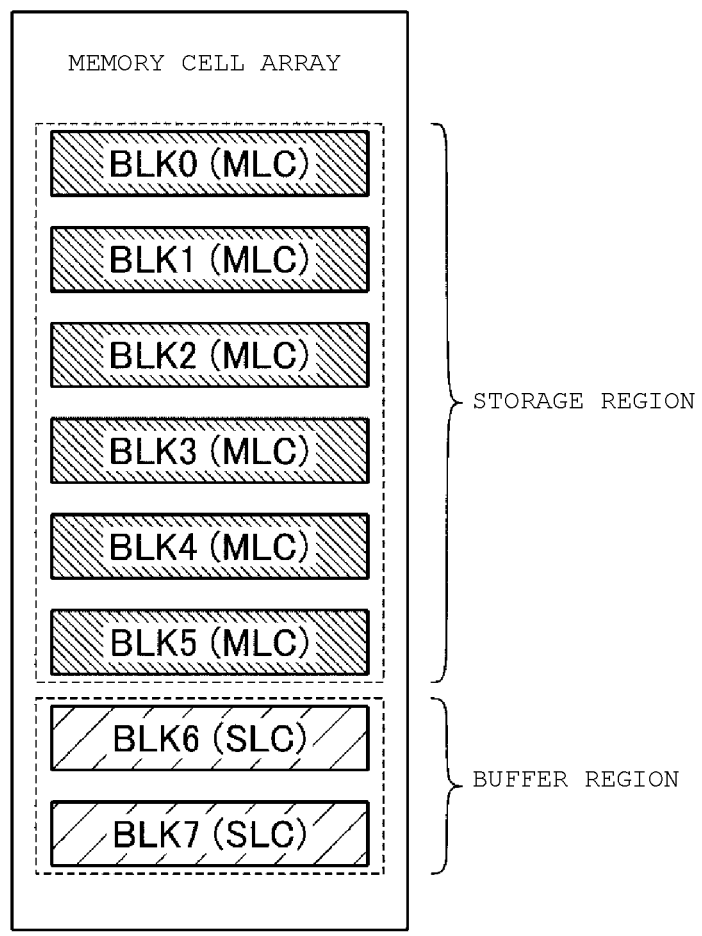
FIG. 12 shows a block diagram showing a block configuration of a memory cell array in a comparison example of the first embodiment.

FIG. 12 shows a block configuration of a memory cell array in a comparison example of the first embodiment. As shown in FIG. 12, the memory cell array in the comparison example includes eight blocks BLK0 to BLK7. In the memory cell array in the comparison example, the blocks BLK0 to BLK5 are allocated as storage regions, and the blocks BLK6 and BLK7 are allocated as buffer regions. That is, in the memory cell array in the comparison example, each of a storage region targeted for compaction operation and a buffer region targeted for buffer write operation is provided to be fixed.

Figure 13:
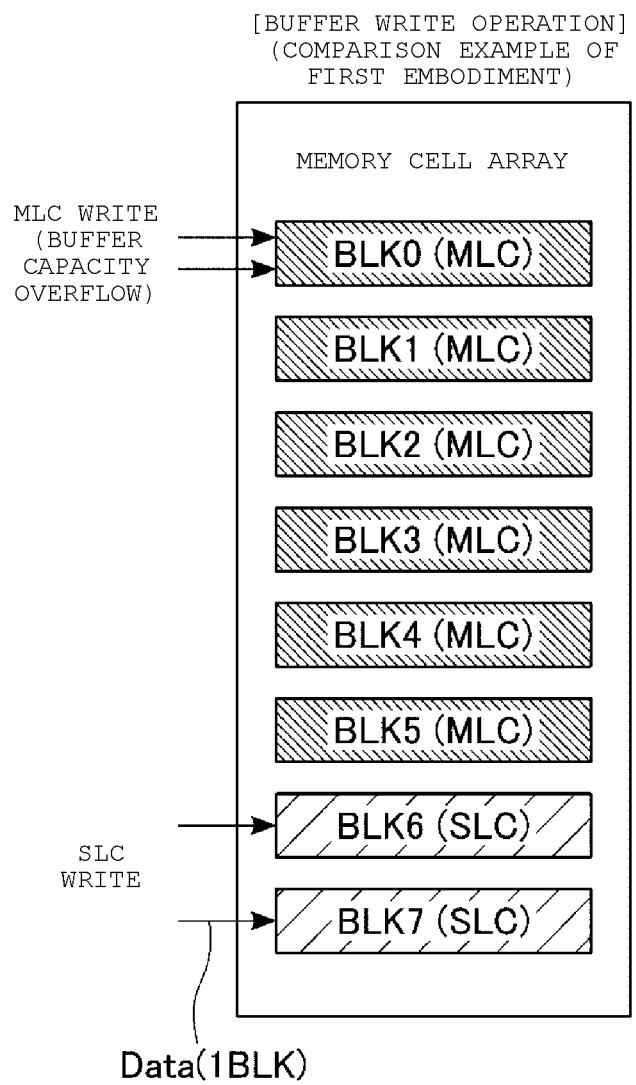
FIG. 13 shows a schematic view illustrating an example of an operation when a capacity of write data exceeds a buffer capacity in the buffer write operation in the comparison example of the first embodiment.

FIG. 13 shows an example of the operation in the case where the buffer write operation is executed to the memory cell array in the comparison example of the first embodiment under the same conditions as in FIG. 10. As shown in FIG. 13, on receiving 4 BLK of the write data from the host device in the comparison example, the memory system first executes the buffer write operation in the SLC mode to the blocks BLK6 and BLK7 serving as the buffer regions.

After 2 BLK of data is written into the blocks BLK6 and BLK7, 2 BLK of write data remains in the memory controller. However, since no buffer region is left in the memory cell array, the SSD executes a write operation using the storage region for the remaining write data. That is, the amount of data beyond the storage capacity of the buffer region, that is, the write data overflowing from the buffer region is written in the applied write mode applied to the storage region.

In the present example, the overflowing 2 BLK of write data is written into the block BLK0 in the MLC mode. The write operation speed in the MLC mode is slower than the write operation speed in the SLC mode. Therefore, it appears to the host device that the operating speed of the sequential writing of the SSD is reduced. When the operating speed of the sequential writing is reduced, an effect such as a reduction in latency of the memory system may occur.

Therefore, the memory system 1 according to the first embodiment uses all of the blocks BLK as a buffer region without fixing the buffer region and the storage region. That is, in the memory system 1 according to the first embodiment, the storage capacity available as a buffer is determined based on the storage capacity of all of the blocks BLK.

As a result, in the memory system 1 according to the first embodiment, even when a large amount of write data is received, it is possible to prevent the total amount of the write data from overflowing beyond buffer capacity. Therefore, the memory system 1 according to the first embodiment can prevent the reduction of the operating speed of the sequential writing and can prevent the reduction in the latency of the memory system 1.

Further, in the memory system 1 according to the first embodiment, if the total number of blocks BLK is the same as the number of the memory cell array in the comparison example, the capacity available as a storage region becomes larger than the capacity in the comparison example. That is, the memory system 1 according to the first embodiment can increase the storage capacity of the memory system 1 while preventing the reduction of the operating speed of the sequential writing.

A case where all of the blocks BLK are targeted for buffer write and compaction operations is presented as an example in the description of the first embodiment, and the present disclosure is not limited thereto. For example, a plurality of types of write modes may not be used in the storage region that is not accessible to the user. Further, in the semiconductor storage device 10, a storage region for the buffer write operation and the storage region for the compaction operation may be provided in the storage region accessible to the user. The memory system 1 according to the first embodiment may include at least a block BLK in which a plurality of types of write modes are used.

2. Second Embodiment

Memory system 1 according to a second embodiment has a table storing the number of W/E cycles corresponding to the plurality of write modes described in the first embodiment and executes a wear leveling control based on the table. In the following, differences in the memory systems 1 according to the first embodiment and the second embodiment will be described.

2-1. Configuration of Memory System 1

Figure 14:
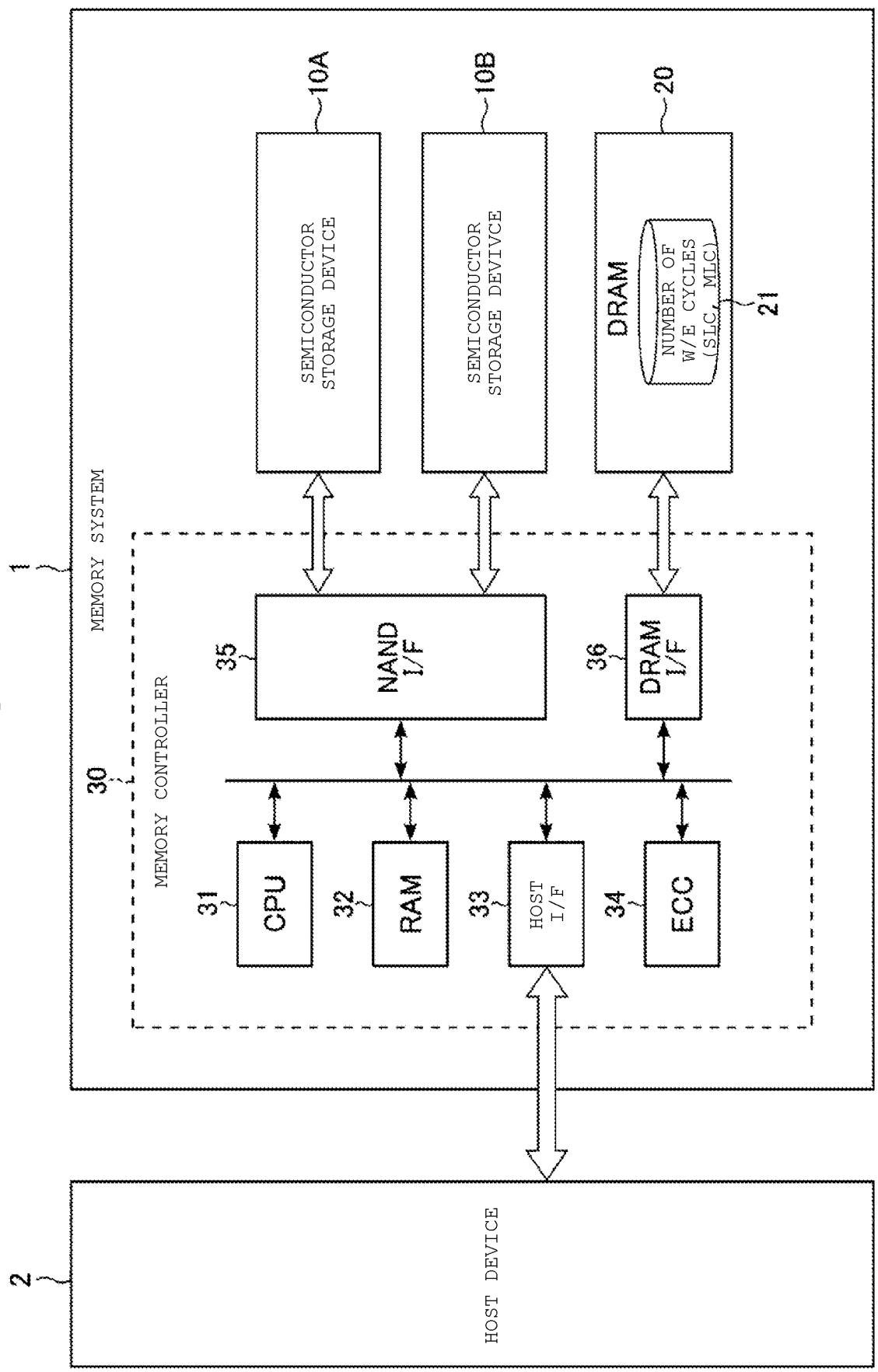
FIG. 14 shows a block diagram of a memory system according to a second embodiment.

FIG. 14 shows a configuration example of the memory system 1 according to the second embodiment. As shown in FIG. 14, the memory system 1 according to the second embodiment has a configuration in which a W/E table 21 is added to the memory system 1 according to the first embodiment. Other configurations of the memory system 1 according to the second embodiment are the same as the configurations of the first embodiment.

The W/E table 21 stores the number of write/erase cycles performed in the SLC mode for each block BLK in the memory cell array 17, for example, the number of W/E cycles performed in the MLC mode, and total number of W/E cycles performed in each write mode, for example. When the write operation in the corresponding write mode is executed, the CPU 31 updates the number of W/E cycles. The number of W/E cycles stored in the W/E table 21 is referred to when the CPU 31 executes a write operation. Details of this operation will be described below.

The W/E table 21 is stored in the DRAM 20, for example. The present disclosure is not limited thereto, and the W/E table 21 may be stored in the memory controller 30. The data of the W/E table 21 is saved in the semiconductor storage device 10 when the power of the memory system 1 is turned off. Then, the data of the W/E table 21 is read from the semiconductor storage device 10 when the power of the memory system 1 is on and is loaded in the DRAM 20 or the like.

The W/E table 21 may be provided for each semiconductor storage device 10, or the number of W/E cycles of blocks BLK in a plurality of semiconductor storage devices 10 may be managed by one table. When the number of W/E cycles of blocks BLK in a plurality of semiconductor storage devices 10 is managed by one table, a parameter relating to the address of the semiconductor storage device 10 is added to the W/E table 21.

2-2. Write Operation

The memory system 1 according to the second embodiment executes wear leveling control with reference to the W/E table 21 when executing the buffer write operation and the compaction write operation described in the first embodiment. The wear leveling control is a method in which the memory controller 30 executes writing into the block BLK having the smallest number of W/E cycles first.

Figures 15, 16:
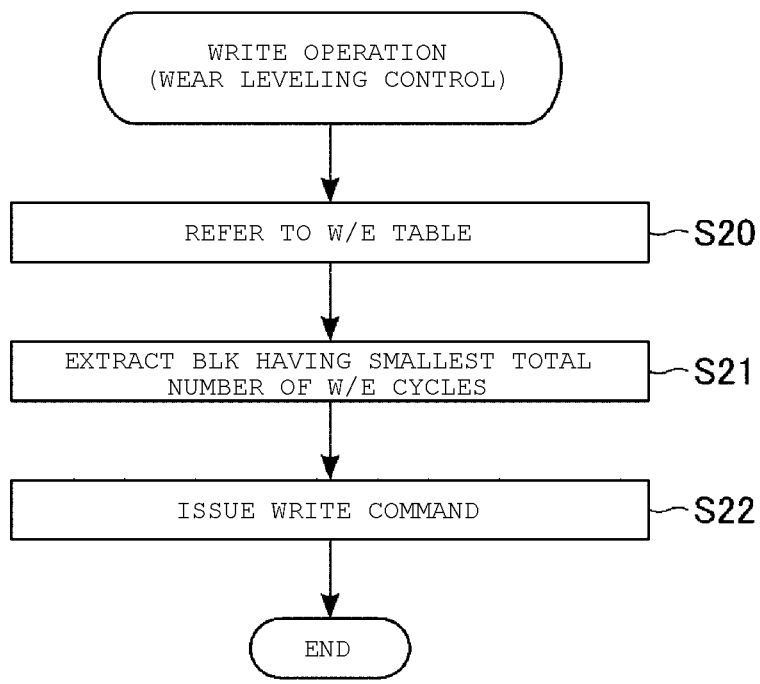
FIG. 15 shows a flowchart illustrating an example of a write operation of the memory system according to the second embodiment.
FIG. 16 shows a table illustrating an example of the number of W/E cycles for each write mode in the memory system according to the second embodiment.

FIG. 15 shows an example of the flow of the write operation by the memory system 1 according to the second embodiment. As shown in FIG. 15, the CPU 31 of the memory controller 30 refers to the W/E table 21 (step S20) when the memory controller 30 starts the write operation. Then, the CPU 31 extracts a block BLK having the smallest total number of W/E cycles based on the W/E table 21 and determines a write destination block BLK out of the block BLK having the smallest total number of W/E cycles (step S21). Then, the CPU 31 specifies the determined block BLK to issue a command set including a write command, and instructs the semiconductor storage device 10 to execute the write operation (step S22).

FIG. 16 is an example of the W/E table 21 in the memory system 1 according to the second embodiment and a case where two types of write modes are used is presented as an example. As shown in FIG. 16, the W/E table 21 stores the number of W/E cycles in the SLC mode, the number of W/E cycles in MLC mode and the total of the number of W/E cycles in each mode in each of the blocks BLK0 to BLKn.

In the example shown in FIG. 16, the total number of W/E cycles of each of blocks BLK0 and BLK1 is 72, the total number of W/E cycles of each of blocks BLK2 and BLK3 is 54, and the total number of W/E cycles of block BLKn is 30. In this case, when the wear leveling control is executed, writing is first executed into the block BLKn having the smallest total number of W/E cycles. For example, when the block BLKn has valid data, either of the blocks BLK2 and BLK3 having the next smallest number of W/E cycles may be selected.

When the SLC mode is used in the buffer write operation and the MLC mode is used in the compaction write operation, one write operation in the MLC mode is executed for two write operations in the SLC mode. Therefore, the preferable relationship is that the number of W/E cycles in the MLC mode is smaller than the number of W/E cycles in the SLC mode in the same block BLK. Ideally, it is preferable that the CPU 31 executes the wear leveling control such that the ratio of the number of W/E cycles in the SLC mode to the number of W/E cycles in the MLC mode is two to one.

In the above description, a case where the W/E table 21 stores the number of W/E cycles in the SLC mode and the number of W/E cycles in the MLC mode is presented as an example, and the present disclosure is not limited thereto. The number of W/E cycles data stored in the W/E table 21 varies based on the write mode used in the buffer write operation and the type and the number of the write operations used in the compaction operation described in the first embodiment.

FIG. 17 shows an example of the W/E table 21 in the memory system 1 according to the second embodiment, and a case where four types of write modes are used is presented as an example. As shown in FIG. 17, the W/E table 21 stores the number of W/E cycles in the SLC mode, the number of W/E cycles in the MLC mode, the number of W/E cycles in the TLC mode, the number of W/E cycles in the QLC mode and the total number of W/E cycles of each of the modes, corresponding to each of the blocks BLK0 to BLKn.

In the example shown in FIG. 17, the total number of W/E cycles of each of the blocks BLK0 and BLK1 is 100 respectively, the total number of W/E cycles of each of the blocks BLK2 and BLK3 is 75 respectively, and the total number of W/E cycles of the block BLKn is 50. In this case, when the wear leveling control is executed, writing is first executed into the block BLKn having the smallest total number of W/E cycles. For example, when the block BLKn stores valid data, either of the blocks BLK2 and BLK3 having the next smallest total number of times of W/E may be selected.

When SLC mode is used in the buffer write operation and each of the MLC mode, TLC mode, and QLC mode is used in the compaction write operation, six write operations in the MLC modes are executed, four write operations in the TLC mode are executed, and three write operations in the QLC mode are executed with respect to 12 write operations in the SLC mode. Therefore, it is preferable that the relationship of the number of W/E cycles in the same block BLK is in the descending order of the SLC mode, the MLC mode, the TLC mode, and the QLC mode, and ideally, it is preferable that the CPU 31 executes the wear leveling control such that the ratio of the number of W/E cycles of the SLC mode to the number of W/E cycles of the MLC mode, the TLC mode, and the QLC mode is 12:6:4:3. This relationship also applies when the memory system 1 uses two or three write modes in the write operation.

As described above, in the memory system 1 according to the second embodiment, the configuration of the W/E table changes as deemed appropriate in accordance with the combination of the write modes used in the buffer write operation and the compaction operation. Then, the method of wear leveling control is appropriately changed based on the combination of the write modes used. The relationship between the number of W/E cycles of each of the write modes in the wear leveling control is determined based on the total number of writing when each write mode is used to write data of a predetermined capacity.

The method of wear leveling control described above is merely an example, and the present disclosure is not limited thereto. A method of wear leveling control may be any method as long as the number of W/E cycles is controlled to be constant within a predetermined error range at least between the blocks BLK in the memory cell array 17. The wear leveling control may be executed based on the number of W/E cycles of each write mode as well as the total number of the W/E.

2-3. Effects of Second Embodiment

As described above, the memory system 1 according to the second embodiment executes the wear leveling control based on the W/E table 21 in which the number of W/E cycles of a plurality of write modes is recorded when respectively executing the buffer write operation and compaction write operation described in the first embodiment. Specifically, the memory system 1 according to the second embodiment executes the wear leveling control based on the total number of W/E cycles recorded for each block BLK, for example.

In this way, in addition to the effect of the first embodiment, the memory system 1 according to the second embodiment has the effect of averaging the wear of the memory cell transistor MT among blocks BLK. That is, the memory system 1 according to the second embodiment can prevent the decrease in reliability of the stored data while preventing the reduction in the operating speed of the sequential writing.

Further, it is also conceivable that the plurality of write modes used in the first embodiment affect the memory cell transistor MT differently. For example, the number of times of the applications and the maximum values of the program voltage Vpgm applied to the selected word line WLsel differ between the write operation in the SLC mode described using FIG. 7 and the write operation in the MLC mode described using FIG. 9. It can be assumed that the wear of the memory cell transistor MT becomes greater in the MLC mode.

That is, the degree of wear of the memory cell transistor MT may differ depending on the combination of the write mode applied to the buffer write operation and the compaction write operation and the number of W/E cycles corresponding to each write operation. Therefore, it is preferable to estimate the reliability of the memory cell transistor MT in accordance with the variation in the degree of wear.

In contrast, the memory system 1 according to the second embodiment can not only control the wear leveling with reference to the total number of the W/E cycles of the W/E table 21 but also control W/E so that the ratio of the number of W/E cycles between the write modes in each block BLK remains approximately constant. In this way, the memory system 1 according to the second embodiment can further average the wear of the memory cell transistor MT among the blocks BLK.

The W/E table 21 updated by the wear leveling control described in the second embodiment described above may also be used to limit the number of W/E cycles. For example, a limit of the number of W/E cycles is set in accordance with the write mode (for example, QLC mode) in which the limit of the number of W/E cycles is the strictest. In this way, in the memory system 1 according to the second embodiment, it is possible to estimate the degree of wear of the memory cell transistor MT based on a certain standard and ensure the reliability of the stored data.

3. Third Embodiment

The memory system 1 according to the third embodiment has the same configuration as the memory system 1 according to the second embodiment and relates to a specific example of the control method of the writing order in the wear leveling control described in the second embodiment. The differences between the memory system 1 according to the third embodiment and the memory systems 1 according to the first and second embodiments will be described below.

3-1. Write Operation

First Example

In a first example of the wear leveling control in the third embodiment, the CPU 31 sets a threshold for a consecutive use of the same write mode for the same block BLK. FIG. 18 shows an example of the W/E table 21 in the memory system 1 according to the third embodiment. As shown in FIG. 18, information on each of the number of times of the consecutive write in the SLC mode and the number of times of the consecutive write in the MLC mode is added to the W/E table 21 described in FIG. 16 to form the W/E table 21 in the first example of the third embodiment.

The number of times of the consecutive write is appropriately updated by the CPU 31. For example, when a write operation in which the same write mode is used is executed, the numerical value of the number of times of the consecutive write in the corresponding write mode is incremented, and when a write operation in which a different write mode is used is executed, the numerical value of the number of times of the consecutive write in each write mode is reset.

In this way, the number of times of the consecutive write in each write mode in each block BLK is recorded in the W/E table 21 in the first example, for example. Then, CPU 31 executes the wear leveling control based on the numerical value of the number of times of the consecutive write with reference to the number of times of the consecutive write of the W/E table 21 at the time of write operation.

Specifically, in a block BLK in which the number of times of the consecutive write in the SLC mode is "four" or more, for example, writing in the MLC mode is first executed in the next write mode. The numerical value used as the threshold value of the number of times of the consecutive write may be set to any numerical value. The wear leveling control in the first example may also be applied to combinations of other write modes. The information on the number of times of the consecutive write may be managed by a table different from the W/E table 21.

Second Example

In a second example of the wear leveling control in the third embodiment, the CPU 31 sets the use order of the write mode in the limit value of the total number of W/E cycles set in each block BLK in any order. For example, in the write operation into the same block BLK, the CPU 31 controls wear leveling so that the SLC mode, the MLC mode, the TLC mode, and the QLC mode are used in this order.

More specifically, when the limit value of the total number of the W/E in a certain block BLK is set to 1,000 and four types of write modes are used, for example, the CPU 31 executes the write operation in SLC mode 480 times first, executes the write operation in the MLC mode 240 times next, executes the write operation in the TLC mode 160 times next, and lastly executes the write operation in the QLC mode 120 times.

Third Example

A third example of the wear leveling control in the third embodiment is a modification of the second example, and the CPU 31 controls the number of times of the execution of each write mode so that the number of times reaches a desired numerical value. For example, in the write operation into the same block BLK, the CPU 31 executes the wear leveling control such that the SLC mode, the MLC mode, the SLC mode, the TLC mode, the MLC mode, the QLC mode, the TLC mode, and the QLC mode are used in this order.

More specifically, when the limit value of the total number of W/E cycles in a certain block BLK is set to 1000 and four types of write modes are used, for example, the CPU 31 executes the write operation in the SLC mode 384 times first, executes the write operation in the MLC mode 192 times next, executes the write operation in the SLC mode 96 times next, executes the write operation in the TLC mode 128 times next, executes the write operation in the MLC mode 48 time next, executes the write operation in the QLC mode 96 times next, executes the write operation in the TLC mode 32 times next, and lastly executes the write operations in the QLC mode 24 times.

The number of times of the execution of each write mode in the second and the third examples of the third embodiment described above may be set to any numerical value. The CPU 31 may control the wear leveling so that the number of times of the execution of each write mode decreases in the order of the SLC mode, the MLC mode, the TLC mode, and the QLC mode. Further, the limit value of the total number of W/E cycles may be set to any value. The use order of the write modes may be appropriately changed in accordance with the type and the number of the write modes used.

3-2. Effects of Third Embodiment

There is a possibility that the degree of wear of the memory cell transistor MT differs depending on the order in which the write modes are used. Therefore, the memory system 1 according to the third embodiment executes the wear leveling control so that bias does not occur in the execution order of each write mode.

In the first example of the third embodiment, the consecutive use of the same write mode in the same block BLK is prevented. As a result, the memory system 1 can prevent the bias in the number of W/E cycles of each write mode in each block BLK.

In each of the second example and the third example of the third embodiment, the order of the write mode applied to the same block BLK is fixed. As a result, the memory system 1 can substantially average the progression of wear in each block BLK.

4. Other Modification Examples and the Like

The memory system of the embodiment includes a semiconductor storage device <for example, 10 in FIG. 1> and a memory controller <for example, 30 in FIG. 1>. The semiconductor storage device includes a plurality of blocks <for example, BLK in FIG. 2> including a plurality of memory cell transistors. The memory controller controls the semiconductor storage device. The plurality of blocks include a first block. The memory cell transistor in the first block stores data of the first bit number in the first period <for example, BLK2 in FIG. 12> and stores data of the second bit number larger than the first bit number in the second period after the first period <for example, BLK2 in FIG. 13>. In this way, it is possible to prevent the reduction of the operating speed of the sequential writing in the memory system according to the embodiment.

A case where the W/E table 21 records the number of W/E cycles in block BLK units is presented as an example in the above embodiments, and it is possible to design the recording unit of the number of W/E cycles in any manner. For example, the number of W/E cycles corresponding to each of the plurality of write modes may be recorded in cell unit CU units in the W/E table 21.

In the above embodiments, a case where the buffer write operation and the compaction write operation are executed in the same semiconductor storage device 10 is presented as an example, and the semiconductor storage device 10 in which the buffer write operation is executed may be different from the semiconductor storage device 10 in which the compaction write operation is executed.

In the above embodiments, a case where the same write mode is used to the memory cell transistor MT in the same block BLK is presented as an example, and cell units CU in which different write modes are used may coexist in the same block BLK. For example, the write mode with the number of bits smaller than the number of bits of other memory cell transistor MT is applied to the memory cell transistor MT, of which the reliability is estimated to be inferior.

In the compaction write operation in the above embodiments, a case where write data of two or more pages is written into one cell unit CU in one write operation is presented as an example, and the present disclosure is not limited thereto. In the compaction write operation, the memory system 1 may write the write data of two or more pages into the cell unit CU by a write operation in two or more stages. In the following, an example of the compaction write operation when the write operation in two stages is used and the TLC mode is used as the write mode will be described.

Before forming the eight threshold voltage distributions described with reference to FIG. 4 in the first embodiment, the memory system 1 executes a rough write operation using, for example, one page of write data and forms two threshold voltage distributions. Thereafter, using three pages of write data, the memory system 1 executes a fine write operation in the cell unit CU in which the rough write operation was executed and forms eight threshold voltage distributions. In the second stage writing, the write data used in the first stage writing is duplicated. Therefore, in the second stage writing, the memory controller 30 transmits the duplicated write data to the semiconductor storage device 10 again or instructs the semiconductor storage device 10 to read the data written in the first stage write.

Figure 19A:
FIGS. 19A-19C depict a threshold voltage distribution illustrating an example of the distribution of threshold voltages of memory cell transistors during the compaction write operation of the semiconductor storage device according to the modification of the first embodiment.
Figure 19B:
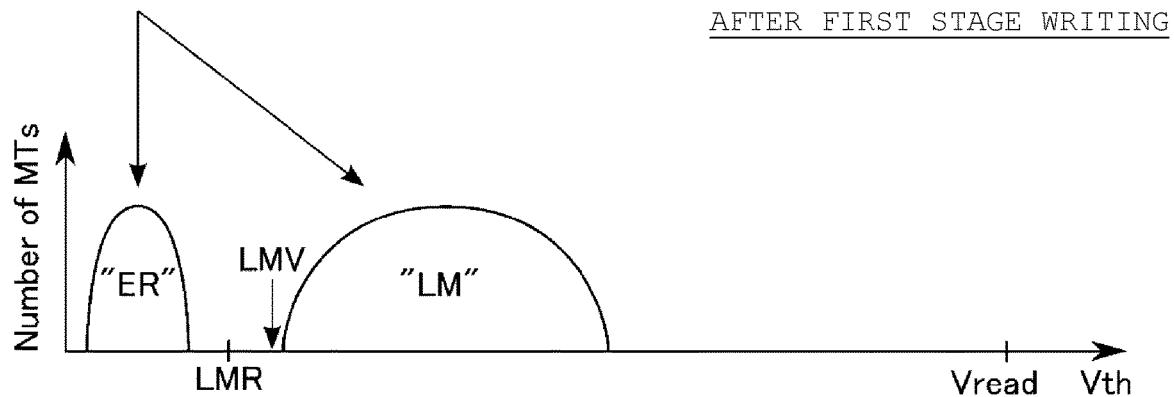
Figure 19C:
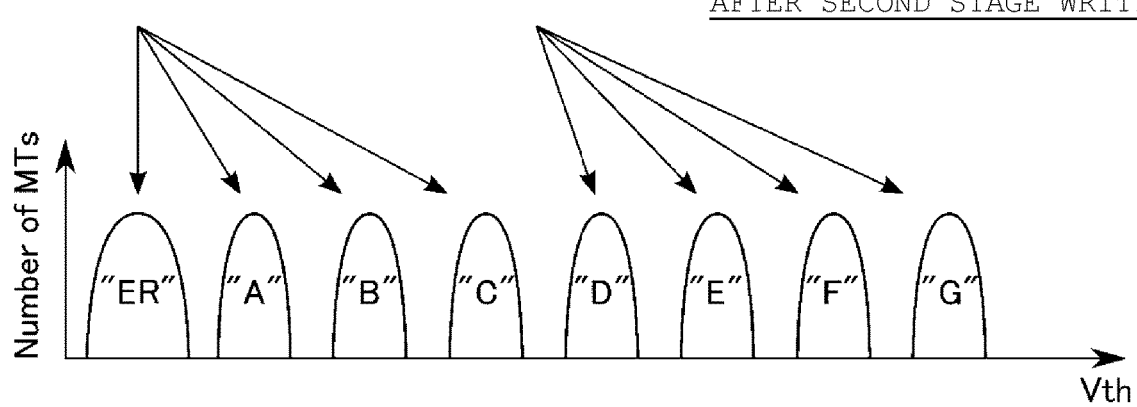

FIG. 19 shows an example of a change in threshold voltage distribution of the memory cell transistor MT in this example. Specifically, FIG. 19A shows the threshold voltage distribution of the memory cell transistor MT before writing (in the erased state), FIG. 19B shows the threshold voltage distribution of the memory cell transistor MT after the first stage writing, and FIG. 19C shows the threshold voltage distribution of the memory cell transistor MT after the second stage writing.

By the first stage writing, the memory system 1 forms the threshold voltage distribution in the "ER" state and the "LM" state shown in FIG. 19B from the threshold voltage distributions in the "ER" state shown in FIG. 19A. Thereafter, by the second stage writing, the memory system forms the threshold voltage distributions in the "ER" state, the "A" state, the "B" state, and the "C" state shown in FIG. 19C from the threshold voltage distribution of the "ER" state shown in FIG. 19B and forms the threshold voltage distributions in the "D" state, the "E" state, "F" state, and the "G" state shown in FIG. 19C from the threshold voltage distribution in the "LM" state shown in FIG. 19B.

The memory cell transistor MT in the "LM" state has the threshold voltage equal to or higher than in the "A" state and equal to or lower than in "D" state. Specifically, the threshold voltage of the memory cell transistor MT in the "LM" state is set between the minimum threshold voltage in the "A" state and the maximum threshold voltage in the "D" state, for example.

Then, the read voltage LMR is set between the "ER" state and the "LM" state and the verification voltage LMV is set corresponding to the "LM" state. Specifically, the read voltage LMR is set between the threshold voltage in the "Z" state and the minimum threshold voltage in the "LM" state. The verification voltage LMV is set between the maximum threshold voltage in the "ER" state and the minimum threshold voltage in the "LM" state and in the vicinity of the "E" state. The read pass voltage Vread after the first stage writing and before the second stage writing is set to a voltage higher than the maximum threshold voltage in the "LM" state. The threshold voltage of the memory cell transistor MT in the "LM" state may be appropriately changed based on the write mode used.

The two-stage write operation described above may be applied to each of the second and third embodiments. Further, the memory system 1 may also use a write mode other than the TLC mode in the two-stage write operation.

The method of the two-stage write operation is not limited to the method described with reference to FIG. 19. For example, after roughly forming the eight threshold voltage distributions by the first stage write operation using the three pages of write data, the memory system 1 executes the write operation of an adjacent cell. Thereafter, the memory system 1 may form precise eight threshold voltage distributions by the second stage write operation using the same three pages of write data. This operation is also applicable to other write modes.

In the above embodiments, "command set" indicates a group of command and address information corresponding to a certain operation. On receiving a command set from the memory controller 30, the semiconductor storage device 10 starts an operation based on the command set. Each command used in the write description may be replaced with any command. It is possible to design the configuration of the command set in any manner. For example, the command inserted before the command "00h" or "80h" may be omitted.

In the present specification, "data set" indicates a group of data configured as one or more pages. "Number of bits" may be used to describe the type of the write mode. For example, the memory system 1 executes the buffer write operation using the first bit number and executes the compaction write operation using the second bit number larger than the first bit number. When the first bit number is one bit, the write mode corresponds to the SLC mode, and when the second bit number is two bits, the write mode corresponds to the MLC mode. This relationship also applies to other bit numbers and write modes.

The memory cell array 17 in the above embodiments may have other configurations. Other configurations of the memory cell array 17 are respectively described in U.S. patent application Ser. No. 12/407,403, filed on Mar. 19, 2009 and entitled "Three-Dimensional Stacked Non-Volatile Semiconductor Memory", U.S. patent application Ser. No. 12/406,524, filed on Mar. 18, 2009 an entitled "Three- Dimensional Stacked Non-Volatile Semiconductor Memory", U.S. patent application Ser. No. 12/679,991, filed on Mar. 25, 2010 and entitled "Non-Volatile Semiconductor Storage Device and Manufacturing Method Thereof", and U.S. patent application Ser. No. 12/532,030, filed on Mar. 23, 2009 and entitled "Semiconductor Memory and Manufacturing Method Thereof", for example. These patent applications are incorporated by reference in their entirety in the present application.

In the above embodiments, the erasing unit may be different from the block BLK, such as described in U.S. patent application Ser. No. 13/235,389, filed on Sep. 18, 2011 and entitled "Non-Volatile Semiconductor Storage Device" and U.S. patent application Ser. No. 12/694,690, filed on Jan. 27, 2010 and entitled "Non-volatile Semiconductor Storage Device." These patent applications are hereby incorporated by reference in their entirety.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a semiconductor storage device including a plurality of blocks, each block including a plurality of memory cell transistors; and
    a memory controller for the semiconductor storage device,
    wherein the plurality of blocks include a first block and a second block, and the memory cell transistor in the first block stores data having a first number of bits during a first period and stores data having a second number of bits larger than the first number during a second period that begins after the first period ends,
    wherein, upon receiving a first data set from an external host device, the memory controller causes the semiconductor storage device to execute a write operation in a first write mode, according to which the first number of bits is stored per memory cell transistor, to write the first data set into the first block, and
    wherein the memory controller causes the semiconductor storage device to execute a read operation of the first data set written into the first block in the first write mode, and causes the semiconductor storage device to execute a write operation in a second write mode, according to which the second number of bits is stored per memory cell transistor, to write the first data set read by executing the read operation into the second block.

2. The memory system according to claim 1,
    wherein the memory controller executes the write operation on the first block during the first period, executes an erasing operation on the first block between the first period and the second period, and executes the write operation in the second write mode on the first block during the second period.

3. The memory system according to claim 1,
    wherein the memory controller causes the semiconductor storage device to execute each of the read operation on the first data set and the write operation in the second write mode on the first data set independently of any instruction received from the host device.

4. The memory system according to claim 1,
    wherein the first and second write modes are different write modes selected from a write mode causing the memory cell transistor to store 1-bit data, a write mode causing the memory cell transistor to store 2-bit data, a write mode causing the memory cell transistor to store 3-bit data, and a write mode causing the memory cell transistor to store 4-bit data, and the first write mode causes the memory cell transistor to store less number of bits per memory transistor than the second write mode.

5. The memory system according to claim 1, further comprising:
    a table storing information on a number of times the write operation is executed in the first write mode, and a number of times the write operation is executed in the second write mode, for each of the plurality of blocks,
    wherein the memory controller is configured to execute a wear leveling control based on the information stored in the table.

6. The memory system according to claim 5,
    wherein the memory controller is configured to execute the wear leveling control so that the number of times the write operation is executed in the first write mode is larger than the number of times the write operation is executed in the second write mode in each of the plurality of blocks.

7. The memory system according to claim 6, wherein
    the first number of bits is 1, and the second number of bits is 2, and
    the memory controller is configured to execute the wear leveling control so that a ratio of the number of times the write operation is executed in the first write mode to the number of times the write operation is executed in the second write mode is approximately 2:1 in each of the plurality of blocks.

8. The memory system according to claim 6, wherein
    the first number of bits is 1, and the second number of bits is 3, and
    the memory controller is configured to execute the wear leveling control so that a ratio of the number of times the write operation is executed in the first write mode to the number of times the write operation is executed in the second write mode is approximately 3:1 in each of the plurality of blocks.

9. The memory system according to claim 6, wherein
    the first number of bits is 1, and the second number of bits is 4, and
    the memory controller is configured to execute the wear leveling control so that a ratio of the number of times the write operation is executed in the first write mode to the number of times the write operation is executed in the second write mode is approximately 4:1 in each of the plurality of blocks.

10. The memory system according to claim 6, wherein
    wherein the first number of bits is 2 bits, and the second number of bits is 3, and
    the memory controller is configured to execute the wear leveling control so that a ratio of the number of times the write operation is executed in the first write mode to the number of times the write operation is executed in the second write mode is approximately 3:2 in each of the plurality of blocks.

11. The memory system according to claim 6, wherein the first number of bits is 2, and the second number of bits is 4, and
the memory controller is configured to execute the wear leveling control so that a ratio of the number of times the write operation is executed in the first write mode to the number of times the write operation is executed in the second write mode is approximately 2:1.

12. The memory system according to claim 6, wherein the first number is 3 bits and the second number is 4 bits, and
the memory controller is configured to execute the wear leveling control so that a ratio of the number of times the write operation is executed in the first write mode to the number of times the write operation is executed in the second write mode is approximately 4:3 in each of the plurality of blocks.

13. The memory system according to claim 1, wherein the memory cell transistor stores data having a third number of bits larger than the second number during a third period that begins after the second period ends, and stores data having a fourth number of bits larger than the third number during a fourth period that begins after the third period ends.

14. A method of performing a write in a memory system comprising a semiconductor storage device including a plurality of blocks, each including a plurality of memory cell transistors, wherein the plurality of blocks includes a first block and a second block, said method comprising:
storing, during a first period, in a memory cell transistor of the first block, data having a first number of bits; and
storing, during a second period that begins after the first period ends, in the memory cell transistor of the first block, data having a second number of bits that is larger than the first number,
wherein, upon receiving a first data set from an external host device, the semiconductor storage device executes a write operation in a first write mode, according to which the first number of bits is stored per memory cell transistor, to write the first data set into the first block, and
wherein the semiconductor storage device executes a read operation of the first data set written into the first block in the first write mode, and executes a write operation in a second write mode, according to which the second number of bits is stored per memory cell transistor, to write the first data set read by executing the read operation into the second block.

15. The method according to claim 14, wherein:
the semiconductor storage device executes the write operation on the first block during the first period;
the semiconductor storage device executes an erasing operation on the first block between the first period and the second period; and
the semiconductor storage device executes the write operation in the second write mode on the first block during the second period.

16. The method according to claim 15, wherein the read operation on the first data set and the write operation in the second write mode on the first data set are executed independently of any instruction received from the host device.

17. The method according to claim 15, wherein the first and second write modes are different write modes selected from a write mode causing the memory cell transistor to store 1-bit data, a write mode causing the memory cell transistor to store 2-bit data, a write mode causing the memory cell transistor to store 3-bit data, and a write mode causing the memory cell transistor to store 4-bit data, and the first write mode causes the memory cell transistor to store less number of bits per memory transistor than the second write mode.

18. The method of claim 14, further comprising:
storing, in a table, information on a number of times the write operation is executed in the first write mode, and a number of times the write operation is executed in the second write mode, for each of the plurality of blocks; and
executing a wear leveling control based on the information stored in the table.

* * * * *